(12) United States Patent
Kataoka et al.

(10) Patent No.: US 8,712,730 B2
(45) Date of Patent: Apr. 29, 2014

(54) CONTROL SYSTEM OF SUBSTRATE PROCESSING APPARATUS, COLLECTING UNIT, SUBSTRATE PROCESSING APPARATUS AND CONTROL METHOD OF THE SUBSTRATE PROCESSING APPARATUS

(75) Inventors: Norihiko Kataoka, Toyama (JP); Shinichiro Mori, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 154 days.

(21) Appl. No.: 13/154,915

(22) Filed: Jun. 7, 2011

(65) Prior Publication Data

US 2011/0301739 A1 Dec. 8, 2011

(30) Foreign Application Priority Data

Jun. 8, 2010 (JP) ................................. 2010-130938
Apr. 25, 2011 (JP) ................................. 2011-96790

(51) Int. Cl.
*G06F 17/40* (2006.01)
*G01N 37/00* (2006.01)
*G06F 15/00* (2006.01)
*G06F 11/30* (2006.01)
*G21C 17/00* (2006.01)
*G06F 19/00* (2011.01)
*H01H 43/00* (2006.01)

(52) U.S. Cl.
USPC ............ 702/187; 702/81; 702/182; 700/108; 700/306

(58) Field of Classification Search
USPC ............. 700/90, 95, 108; 702/57, 79, 81, 83, 702/182, 187
See application file for complete search history.

(56) References Cited

U.S. PATENT DOCUMENTS

| | | | |
|---|---|---|---|
| 5,450,403 A * | 9/1995 | Ichii et al. | 370/242 |
| 6,669,539 B1 * | 12/2003 | Amartur | 451/57 |
| 7,117,040 B2 * | 10/2006 | Masuda et al. | 700/1 |
| 7,200,580 B1 * | 4/2007 | Kovish et al. | 706/12 |
| 7,814,756 B2 * | 10/2010 | Masui | 62/132 |
| 7,937,232 B1 * | 5/2011 | Chow et al. | 702/79 |
| 8,359,117 B2 * | 1/2013 | Kataoka et al. | 700/108 |
| 2004/0128918 A1 * | 7/2004 | Yang et al. | 52/7 |
| 2008/0063078 A1 * | 3/2008 | Futenma et al. | 375/240.19 |
| 2010/0214296 A1 | 8/2010 | Kawamura | |
| 2011/0026407 A1 * | 2/2011 | Yamada et al. | 370/242 |

FOREIGN PATENT DOCUMENTS

| | | |
|---|---|---|
| JP | A-9-130871 | 5/1997 |
| JP | A-2001-236119 | 8/2001 |
| JP | B2-3630245 | 3/2005 |
| KR | 10-2010-0005159 | 1/2010 |

OTHER PUBLICATIONS

Aug. 10, 2012 Korean Office Action issued in Korean Patent Application No. KR 10-2011-0051152 (with translation).
Jun. 18, 2013 Office Action issued in Chinese Application No. 201110160201.4 (with translation).

\* cited by examiner

*Primary Examiner* — Crystal J Barnes-Bullock
(74) *Attorney, Agent, or Firm* — Oliff PLC

(57) ABSTRACT

There is provided a control system of a substrate processing apparatus, comprising: a collecting unit for collecting data from each component that constitutes a substrate processing apparatus, the collecting unit further comprising at least: a buffer for temporarily storing collected data; and a sorting part for rearranging the collected data, based on time data attached to the collected data.

12 Claims, 14 Drawing Sheets

CONTROL SYSTEM OF SUBSTRATE PROCESSING APPARATUS, COLLECTING UNIT, SUBSTRATE PROCESSING APPARATUS AND CONTROL METHOD OF THE SUBSTRATE PROCESSING APPARATUS

BACKGROUND

1. Technical Field

The present invention relates to a control system of a substrate processing apparatus, a collecting unit, a substrate processing apparatus and a control method of the substrate processing apparatus, and particularly relates to the control system of the substrate processing apparatus, the collecting unit, the substrate processing apparatus suitable for realizing highly frequent data collection regarding the substrate processing apparatus, and the control method of the substrate processing apparatus.

2. Description of Related Art

The substrate processing apparatus, for example, a semiconductor manufacturing device is constituted of a plurality of components (devices), and a service life or a failure rate is different for each component, and therefore a stable operation of each component of the semiconductor manufacturing device is an important element for manufacturing a semiconductor.

In a semiconductor manufacturing system, being an example of a substrate processing system, in order to form a film on a semiconductor substrate (wafer), being a kind of a substrate, control is performed based on a procedure of defining the components that constitute the semiconductor manufacturing device, for example based on a recipe. The recipe defines the procedure of a control performed to temperature, pressure, and gas, regarding a furnace in which the film is formed on the semiconductor substrate. Thus, control required for each component such as a sub-control part (included in the component) including a temperature control part and a pressure control part, etc., MFC for adjusting a flow rate of gas, and a valve for opening/closing a gas flow, is sequentially performed. Further, drive control for charging and discharging the semiconductor substrate into/from the furnace for carrying out film formation, is defined by this recipe in some cases.

In a system of controlling the semiconductor manufacturing device, a plurality of components need to be suitably control led with high frequency. However, it is difficult to output data collected from each component with high frequency as is requested by a semiconductor manufacturing plant.

Note that conventionally, data is directly collected by an external storage medium, and the collected data is utilized off-line. Specifically, the collected data is stored in the external storage medium during executing the recipe, and data analysis is performed by carrying the external storage medium to outside (for example, see patent document 1). However, in a recent on-line tendency, off-line is not preferable. In recent years, the collected data is reported (transmitted) through a host control line. However, a particle size (frequency) requested by the semiconductor manufacturing plant side is not obtained even by a method of utilizing the host control line. For example, the frequency with which the data is transmitted by this method is generally about 0.5 Hz to 2 Hz, and does not reach the frequency of 10 Hz or more which is requested by a client (semiconductor manufacturing plant side).

Therefore, in recent years, in the semiconductor manufacturing plant, high frequent data collection is desired to the control system of the semiconductor processing apparatus, for the purpose of performing production control regarding the semiconductor manufacturing device, performance and operation rate management, and failure detection management, etc.

However, in a conventional control system of the semiconductor processing apparatus, control data including process control data (such as data of temperature, pressure, flow rate of gas, etc.) and transfer control data, event data, and exceptional (abnormal) data, etc., can not be collected at a high speed. Wherein, event means the data of showing start and end of the operation of each component controlled during processing of the substrate, and reporting start and end of the step executed during processing the substrate. Further, as examples of the event, start of carrying wafers, end of carrying wafers, start of a process (recipe), end of the process (recipe), loading of a carrier, and unloading of the carrier, etc., can be given.

(Patent document 1) Japanese Patent Publication No. 3630245

SUMMARY OF THE INVENTION

An object of the present invention is to provide a control system of a substrate processing apparatus, a control unit, the substrate processing apparatus and a control method of the substrate processing apparatus, capable of outputting data with high precision and high frequency, by solving the aforementioned problems.

According to a first aspect of the present invention, there is provided a control system of a substrate processing apparatus, comprising:

a collecting unit for collecting data from each component that constitutes a substrate processing apparatus, the collecting unit further comprising at least:

a buffer for temporarily storing collected data; and a sorting part for rearranging the collected data to the time series, based on time data attached to collected the data.

According to other aspect of the present invention, there is provided a collecting unit for collecting data from each component, comprising:

a buffer for temporarily storing the data;

wherein when the data is stored in the buffer, the data is rearranged to the time series, based on time data attached to the data.

According to other aspect of the present invention, there is provided a substrate processing apparatus, comprising:

a collecting unit for collecting data from each component, the collecting unit further comprising:

a buffer for temporarily storing the data, wherein when the data is stored in the buffer, the data is rearranged to the time series, based on time data attached to the data.

According to other aspect of the present invention, there is provided a control method of a substrate processing apparatus having a collecting unit for collecting data from each component, the collecting unit further comprising:

a buffer for temporarily collecting the data, wherein when the data is stored in the buffer, the data is rearranged to the time series, based on time data attached to the data.

According to the present invention, generation time of each kind of data generated in the substrate processing system can be controlled. Therefore, data with time lag controlled, which is generated in data processing, can be provided to a semiconductor manufacturing plant side from a semiconductor manufacturing device side, being a kind of the substrate processing apparatus. Accordingly, when analysis is performed to data collected during processing the substrate by a system of the semiconductor manufacturing plant side, the data with time lag controlled, can be utilized, thus improving accuracy of data analysis.

DESCRIPTION OF PREFERRED EMBODIMENT OF THE INVENTION

An embodiment of the present invention will be described hereafter.

First Embodiment (Outline of the First Embodiment)

A typical aspect of this embodiment provides a substrate processing apparatus constituted of a plurality of components; a control unit that performs control based on a procedure of defining the components (recipe) that constitute the substrate processing apparatus; and a collecting unit that collects data from each component, the collecting unit further comprising a buffer that temporarily stores the data, wherein when the data is stored in the buffer, the data is controlled by being rearranged to the time order of generating the data. According to this embodiment, a generation order of each kind of data generated in the substrate processing system can be controlled. Further, according to this embodiment, highly precise and highly frequent data attached with data generation time, can be supplied to the system of the semiconductor manufacturing plant side from the system of the semiconductor manufacturing device side. Therefore, the data can be analyzed at the semiconductor manufacturing plant side, by using such data.

The first embodiment will be specifically described hereafter.

(1-1) Structure of the Substrate Processing System

First, the structure of the substrate processing system according to an embodiment of the present invention will be described by using FIG. 1.

Figure 1:
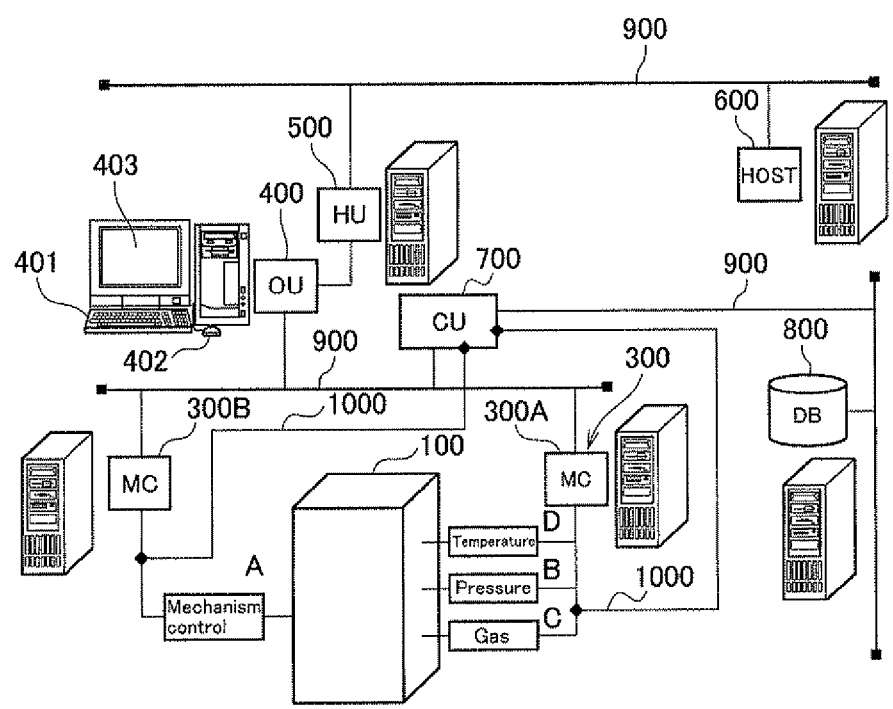
FIG. 1 is a block diagram of a substrate processing system according to an embodiment of the present invention.

As shown in FIG. 1, the substrate processing system comprises at least: a substrate processing apparatus 100; a module control part (MC) 300, being a control unit that constitutes a control part; an operation unit (OU) 400, being a terminal device that constitutes an operation part; and a collecting unit (CU) 700. Further, the substrate processing system may also be constituted by including a host interface unit (HU) 500; a host computer 600; and a database (DB) 800. Further, the substrate processing system according to this embodiment is a dispersion processing system for sending data acquired by the substrate processing apparatus 100, to the HOST600 and the DB800 at the semiconductor manufacturing plant side far away from an installment place of the substrate processing system. Note that although FIG. 1 shows MC300 and OU400 as separate bodies from the substrate processing apparatus 100, they are actually constituted to be included in the substrate processing apparatus 100. Meanwhile, as shown in FIG. 1, although CU700 is constituted separately from the substrate processing apparatus 100, it may be included in the substrate processing apparatus 100 similarly to the MC300.

The substrate processing apparatus 100 is constituted as the semiconductor manufacturing device for manufacturing the semiconductor device. The semiconductor processing apparatus 100 is constituted of a plurality of components. Each component generates data. Here, the component shows an entire body that constitutes the substrate processing apparatus, such as a drive control part (a transfer control part and a temperature control part, etc.) or each sensor or each actuator. Further, in FIG. 1, since the MC300 and the OU400 shown as separate bodies, constitute the substrate processing apparatus substantially, they are regarded as the components. However, in this embodiment, explanation will be given for the structure of the substrate processing system shown in FIG. 1. The substrate processing apparatus 100 receives the recipe transmitted from the HOST600 and the recipe execution of which is indicated by the OU400, and executes the processing of the substrate based on the received recipe. Specifically, such a recipe describes a procedure of processing the substrate to the time series, and the MC300 controls each component in the substrate processing apparatus 100 based on the aforementioned recipe including a plurality of steps. Note that details of the substrate processing apparatus 100 will be described later.

The MC300 is provided between the substrate processing apparatus 100 and the OU400, and is connected via a filed network 1000. Each component in the substrate processing apparatus 100 is controlled by the MC300. The MC300 is a control part for performing a required control to the substrate processing apparatus 100 based on a definition (for example recipe) of a control procedure which defines the components that constitute the substrate processing apparatus 100. The MC300 performs control required for film formation, and control of a transfer mechanism for carrying the substrate including the semiconductor substrate and a carrier, etc., for storing a plurality of substrates, and required numbers of control parts are prepared in accordance with the system. In an example shown in the figure, there are two control parts such as MC300A, being a first control part for controlling temperature, pressure, and gas, which performs control required for film formation, and MC300B, being a second control part for drive control controlling the transfer mechanism for carrying the carrier, etc. Here, in FIG. 1, although the MC300 and the substrate processing apparatus 100 are shown as separate bodies, the MC300 constitutes the substrate processing apparatus 100. Note that details of the MC300 will be described later.

OU400 is a terminal device for editing a target recipe. Further, the OU400 is the terminal device for collecting data generated by each component, from the MC300. The OU400 is provided so as to be connected to the MC300 via an ordinary network 900, and has an input/output device such as a keyboard 401 and a mouse 402, and an operation screen 403. The operation screen 402 displays an input screen into which specified data is inputted by an operator, and a display screen showing a state, etc., of the device. Here, although FIG. 1 shows the OU400 and the substrate processing apparatus 100 as separate bodies, the OU400 may constitute the substrate processing apparatus 100.

HU500 functions as an interface (I/F) between the substrate processing system and the semiconductor manufacturing plant. The HU500 has a function of sending data collected from the substrate processing apparatus, to the HOST600. The HU500 is a receiving unit not directly affecting control operation. Here, although FIG. 1 shows the HU500 and the substrate processing apparatus 100 as separate bodies, the HU500 may constitute the substrate processing apparatus 100.

HOST600 is installed at the semiconductor manufacturing plant side. The HOST600 is connected to the OU400 from the HU500 via the ordinary network 900. The HOST600 stores a plurality of recipes and stores a correlation between lot information and the recipes, and based on the received lot information and the stored correlation, selects one recipe from the stored plurality of recipes, and transmits the selected recipe to the substrate processing apparatus 100.

CU700 is an exclusive collecting unit installed on a port different from the HU500 in the substrate processing apparatus, for the purpose of collecting data at a high speed. The CU700 is connected to the OU400 by the ordinary network 900, and is directly connected to the substrate processing apparatus by field network 1000. The CU700 temporarily stores (accumulates) the data collected from the plurality of components of the substrate processing apparatus 100 by the OU400 via MC300A and MC300B. Note that the CU700 is a unit not directly affecting the control operation, similarly to the HU500. Here, although FIG. 1 shows the CU700 and the substrate processing apparatus 100 as separate bodies, the CU700 may constitute the substrate processing apparatus 100. Details of the CU700 will be described later.

Data passing through the MC300 and the OU400 out of the data of the substrate processing apparatus 100, is collected by the CU700 via the network 900, and thereafter is reported to the DB800. In addition, the data may also be reported to the HOST600 similarly.

Note that these OU400/MC300/HU500, etc., can be constituted based on a software program, and therefore don't necessarily have 1 to 1 relations with a physical computer unit for actual operation. For example, various structures are possible, such as a combination of the OU400 and the HU500, or a combination of the OU400 and the MC300. For example, a structure of operating on the same computer is also possible.

Further, a dispersion processing system according to the aforementioned embodiment, shows a case that one substrate processing apparatus 100 is connected to the HOST, for example. A plurality of substrate processing apparatuses 100 may also be connected to the HOST and may be controlled.

(1-2) The Structure of the Substrate Processing Apparatus

Figure 6:
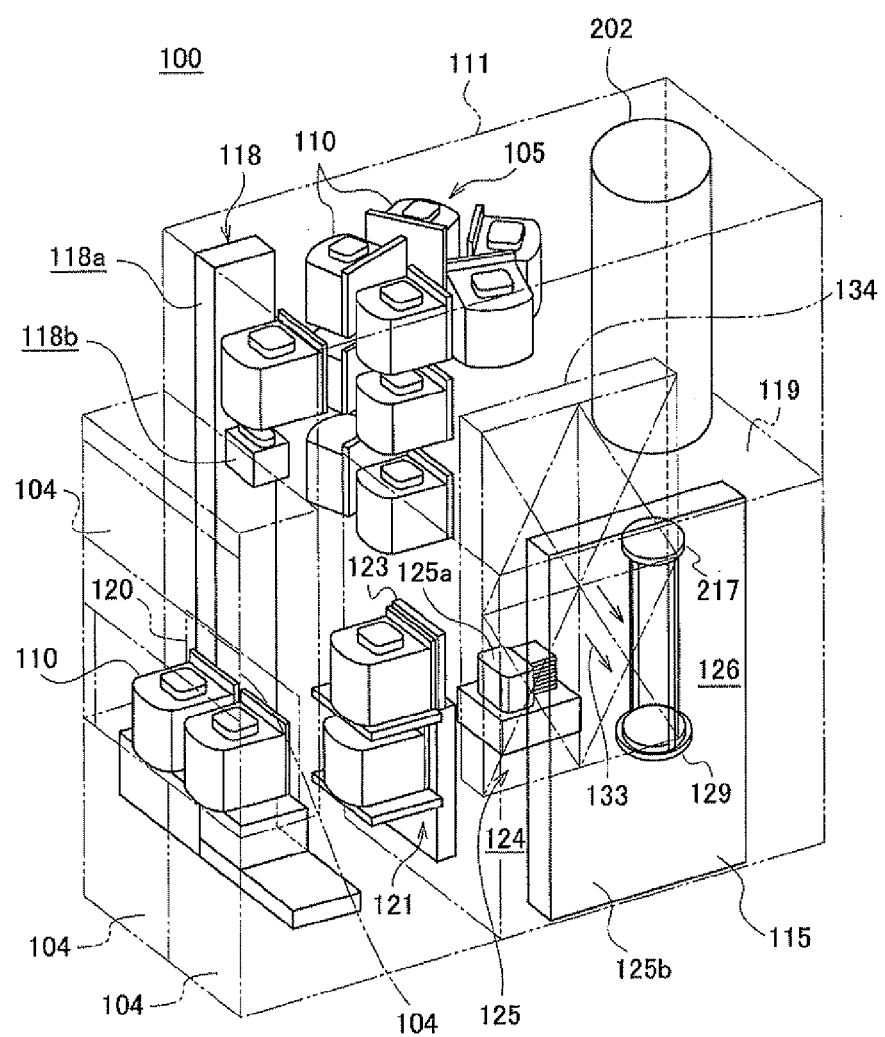
FIG. 6 is a perspective view showing a substrate processing apparatus according to an embodiment of the present invention.
Figure 7:
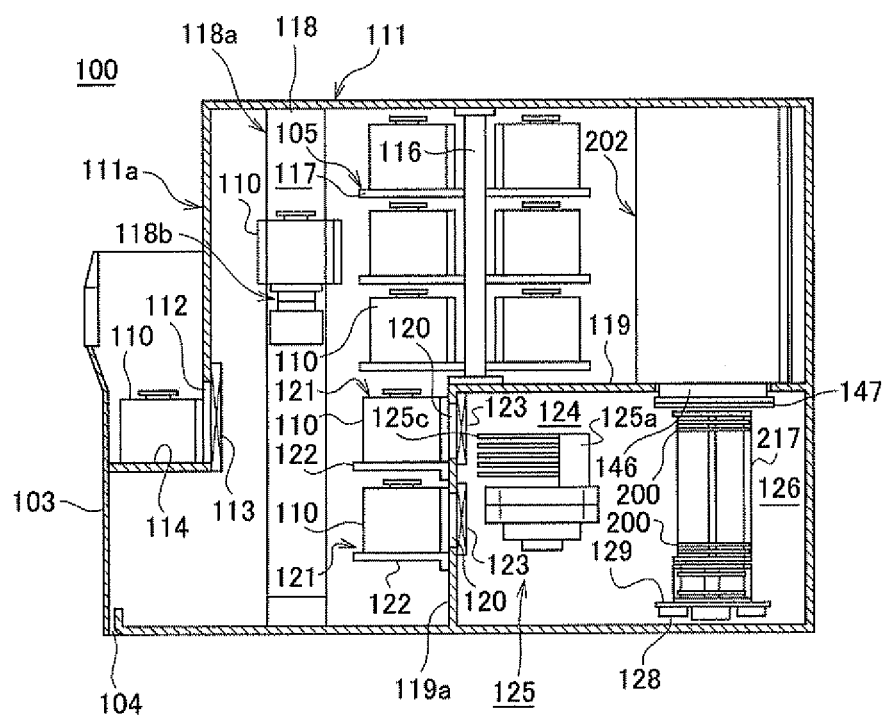
FIG. 7 is a side face transparent view showing the substrate processing apparatus according to an embodiment of the present invention.

Subsequently, the structure of the substrate processing apparatus 100 according to this embodiment will be described, with reference to FIG. 6 and FIG. 7. FIG. 6 is a perspective transparent view of the substrate processing apparatus according to an embodiment of the present invention. FIG. 7 is a side face transparent view of the substrate processing apparatus according to an embodiment of the present invention. Note that the substrate processing apparatus 100 according to this embodiment is constituted as a vertical semiconductor manufacturing device that applies oxidation, dispersion processing, and CVD processing to the substrate such as a wafer.

As shown in FIG. 6 and FIG. 7, the substrate processing apparatus 100 according to this embodiment includes a casing 111 constituted as a pressure-resistance container. A front face maintenance port 103, being an opening part provided so that maintenance can be performed, is opened on a front face of a front face wall 111a of the casing 111. A pair of front face maintenance doors 104 for opening/closing the front face maintenance port 103, are provided to the front face maintenance port 103. A pod (substrate container) 110 storing the wafer (substrate) 200 such as silicon is used as a carrier for carrying the wafer 200 to inside/outside of the casing 111.

A pod loading/unloading port (substrate container loading and unloading port) 112 is opened on the front face wall 111a of the casing 111, so as to communicate inside and outside of the casing 111. The pod loading/unloading port 112 is opened and closed by a front shutter (open/close mechanism of substrate container loading and unloading port) 113. A load port (substrate container transfer table) is installed in front of the front face of the pod loading/unloading port 112. The pod 110 is placed and positioned on the load port 114. The pod 110 is carried onto the load port 114 by an in-step carrying device (not shown).

A rotary pod shelf (substrate container placement shelf) 105 is installed in an upper part of approximately a central portion of the casing 111 in a longitudinal direction. A plurality of pods 110 are placed on the rotary pod shelf 105. The rotary pod shelf 105 includes a strut 116 erected vertically and intermittently rotated in a horizontal surface, and a plurality of shelf plates (substrate container placement tables) 117 radially supported by the strut 116 at each position of upper, lower, and middle stages. A plurality of pods 110 are respectively held by the plurality of shelf plates 117 in a state of being placed thereon.

A pod carrying device (substrate container carrying device) 118 is installed between the load port 114 and the rotary pod shelf 105 in the casing 111. The pod carrying device 118 is constituted of a pod elevator (substrate container elevating mechanism) 118a capable of being elevated while holding the pod 110, and a pod transfer mechanism (substrate container transfer mechanism) 118b, being a transfer mechanism. The pod carrying device 118 mutually carries the pod 110 among the load port 114, the rotary pod shelf 105, and the pod opener (open/close mechanism of substrate container lid member) 121, by a sequential operation of the pod elevator 118a and the pod transfer mechanism 118b.

A sub-casing 119 is provided in a lower part of the casing 111, extending from approximately the central portion to the rear end in the longitudinal direction of the casing 111. A pair of wafer loading/unloading ports (substrate loading/unloading outlets) 120 for carrying the wafer 200 to the inside/outside of the sub-casing 119, are provided side by side in upper and lower stages in a vertical direction. Pod openers 121 are respectively installed in the upper and lower wafer loading/unloading outlets 120.

Each pod opener 121 includes a pair of placement tables 122 on which the pods 110 are placed, and a cap attaching/detaching mechanism (lid member attaching/detaching mechanism) 123 for attaching and detaching a cap (lid member) of the pod 110. The pod opener 121 opens/closes a wafer charging/discharging port, by attaching/detaching the cap of the pod 110 placed on the placement table 122, by the cap attaching/detaching mechanism 123.

A transfer chamber 124 isolated fluidically from a space in which the pod carrying device 118 and the rotary pod shelf 105, etc., are installed, is provided in the sub-casing 119. A wafer transfer mechanism (substrate transfer mechanism) 125 is installed in a front side area of the transfer chamber 124. The wafer transfer mechanism 125 is constituted of a wafer transfer device (substrate transfer device) 125a capable of horizontally rotating or linearly moving the wafer 200, and a wafer transfer device elevator (substrate transfer device elevating mechanism) 125b for elevating the wafer transfer device 125a. As shown in FIG. 6, the wafer transfer device elevator 125b is installed between a right end portion of a front area of the transfer chamber 124 in the sub-casing 119, and a right side end portion in the casing 111. The wafer transfer device 125a includes a tweezer (substrate holder) 125c, being a placement part of the wafer 200. By a sequential operation of these wafer transfer device elevator 125b and wafer transfer device 125a, the wafer 200 can be charged and discharged into/from the boat (substrate holder) 217.

A weighting part 126 for housing the boat 217 to set it in a weighting state is formed in a rear side area of the transfer chamber 124. A processing furnace 202, being a substrate processing system, is provided in an upper part of the weighting part 126. A lower end portion of the processing furnace 202 is opened/closed by a throat shutter (throat open/close mechanism) 147.

As shown in FIG. 6, a boat elevator (substrate holder elevating mechanism) 115 for elevating the boat 217 is installed between a right end portion of the weighting part 126 in the sub-casing 119, and a right side end portion in the casing 111. An arm 128, being a connector, is connected to an elevating table of the boat elevator 115. A seal cap 219, being a lid member, is horizontally set on the arm 128. The boat 217 is vertically supported by the seal cap 219, so that the lower end portion of the processing furnace 202 can be closed.

The boat 217 includes a plurality of holding members. The boat 217 is formed so that a plurality of (for example, about 50 to 125 sheets of) wafers 200 are respectively held, in a state of being arranged in the vertical direction, with their centers aligned.

As shown in FIG. 6, A clean unit 134 made of a dust proof filter and supply fan is installed at a right side end portion, being an opposite side to the wafer transfer device elevator 125b side and the boat elevator 115 side in the transfer chamber 124, so as to supply clean atmosphere or clean air 133, being clean atmosphere or inert gas. Although not shown, a notch aligner, being a substrate aligner for aligning a position in a circumferential direction of the wafer is installed between the wafer transfer device 125a and the clean unit 134.

Clean air 133 blown out from the clean unit 134 is flown through the notch aligner, the wafer transfer device 125a, and the boat 217 in the weighting part 126, and thereafter is sucked by a duct not shown and is exhausted to outside of the casing 111, or is circulated to a primary side (supply side), being a sucking side of the clean unit 134, and is blown out again into the transfer chamber 124 by the clean unit 134.

(1-3) Operation of the Substrate Processing Apparatus

Next, the operation of the substrate processing apparatus 100 according to this embodiment will be described, with reference to FIG. 6 and FIG. 7.

As shown in FIG. 6 and FIG. 7, when the pod 110 is supplied to the load port 114, the pod loading/unloading port 112 is opened by the front shutter 113. Then, the pod 110 on the load port 114 is loaded into the casing 111 from the pod loading/unloading port 112 by the pod carrying device 118.

The pod 110 loaded into the casing 111 is automatically carried onto the shelf plate 117 of the rotary pod shelf 105 by the pod carrying device 118, and is temporarily stored therein, and thereafter is transferred onto the placement table 122 of one of the pod openers 121 from the shelf plate 117. Note that the pod 110 loaded into the casing 111 may also be directly transferred onto the placement table 122 of the pod opener 121 by the pod carrying device 118. At this time, the wafer loading/unloading port 120 of the pod opener 121 is closed by the cap attaching/detaching mechanism 123, and the clean air 133 is flown through the transfer chamber 124, so that the transfer chamber 124 is filled with the clean air 133. For example, by filling inside of the transfer chamber 124 with nitrogen gas as the clean air 133, an oxygen concentration in the transfer chamber 124 is for example 20 ppm or less, and is set to be further lower than the oxygen concentration in the casing 111, being the atmosphere.

An opening side end face of the pod 110 placed on the placement table 122 is pushed against an opening edge portion of the wafer loading/unloading port 120 on a front face wall 119a of the sub-casing 119, and its cap is detached by the cap attaching/detaching mechanism 123, to thereby open the wafer charging/discharging port. Thereafter, the wafer 200 is picked-up from the inside of the pod 110 through the wafer charging/discharging port by the tweezer 125c of the wafer transfer device 125a, with orientation aligned by the notch aligner, and thereafter is loaded into the weighting part 126 in rear of the transfer chamber 124, and is charged into the boat 217. The wafer transfer device 125a with wafer 200 charged into the boat 217, is returned to the pod 110, and next wafer 200 is charged into the boat 217.

During charging work of the wafer into the boat 217 by the wafer transfer mechanism 125 in one of the pod openers 121 (upper stage or lower stage), another pod 110 is carried by the pod carrying device 118 from the rotary pod shelf 105, and is transferred onto the placement table 122 of the pod opener 121, and an opening work of the pod 110 by the pod opener 121 is simultaneously executed.

When previously specified number of wafers 200 are charged into the boat 217, the lower end portion of the processing furnace 202, which is closed by the throat shutter 147, is opened by the throat shutter 147. Subsequently, the boat 217 holding a group of the wafers 200, is loaded into the processing furnace 202 by elevating the seal cap 219 by the boat elevator 115.

After loading, arbitrary processing is applied to the wafer 200 in the processing furnace 202. After processing, the boat 217 in which the wafers 200 after processing are stored, is unloaded from the processing chamber 201 by a procedure almost reverse to the aforementioned procedure, excluding the aligning step of aligning the wafers by the notch aligner 135, and the wafers 200 after processing are unloaded to outside of the casing 111.

(1-4) Structure of the Processing Furnace

Figure 8:
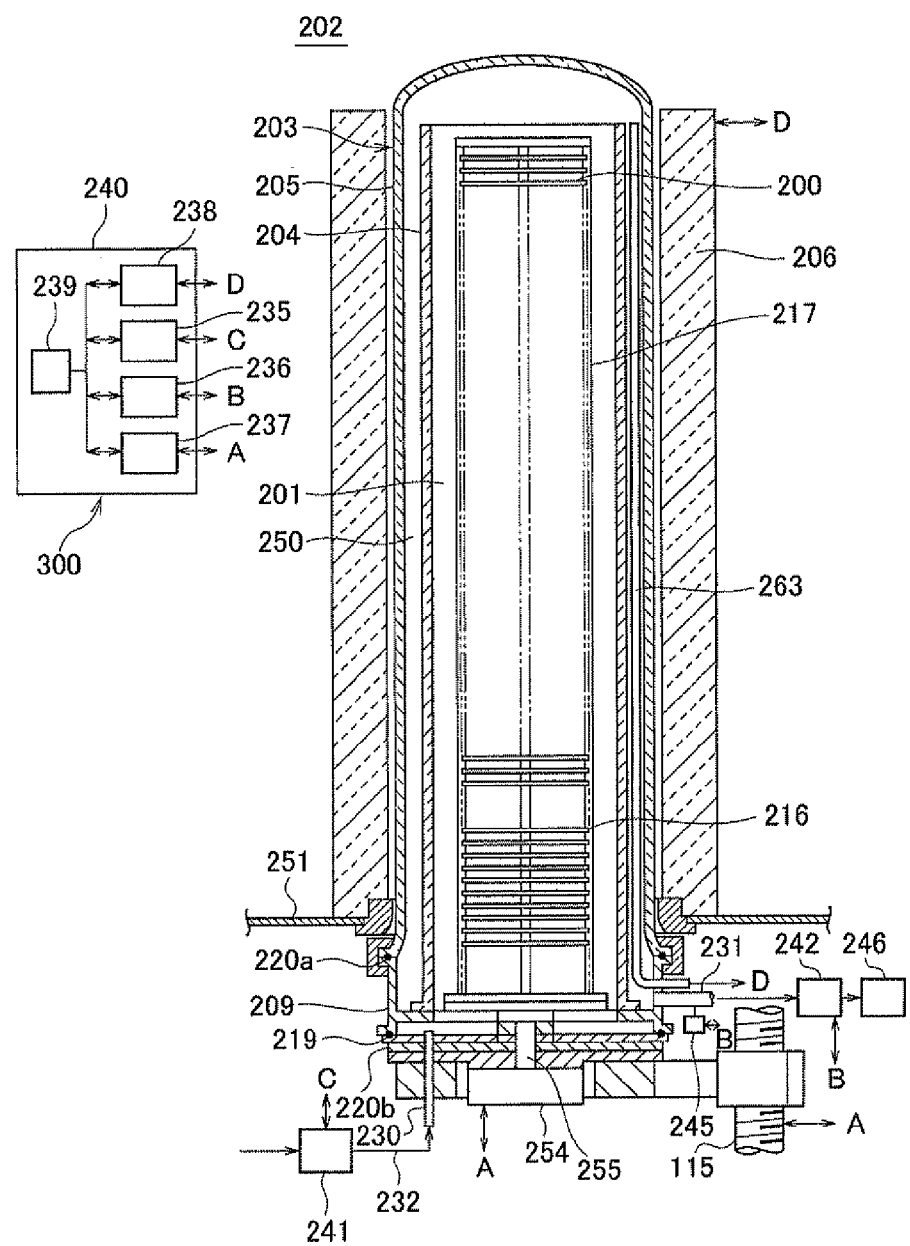
FIG. 8 is a vertical sectional view of a processing furnace of the substrate processing apparatus according to an embodiment of the present invention.

Subsequently, the structure of the processing furnace 202 according to this embodiment will be described by using FIG. 8. FIG. 8 is a vertical sectional view of the processing furnace of the substrate processing apparatus according to an embodiment of the present invention.

As shown in FIG. 8, the processing furnace 202 includes a process tube 203, being a reaction tube. The process tube 203 includes an inner tube 204, being an internal reaction tube, and an outer tube 205, being an external reaction tube provide to outside of the inner tube 204. The inner tube 204 is made of a heat resistant material such as quartz ($SiO_2$) or silicon carbide (SIC) and is formed in a cylindrical shape with an upper end and a lower end opened. The processing chamber 201 for processing the wafer 200, being the substrate, is formed in a cylindrical hollow part of the inner tube 204. Inside of the processing chamber 201 is formed so that the boat 217 as will be described later can be housed therein. The outer tube 205 is provided concentrically with the inner tube 204. The outer tube 205 is formed so that an inner diameter is larger than an outer diameter of the inner tube 204 and is formed in a cylindrical shape with upper end closed and lower end opened. The outer tube 205 is made of the heat resistant material such as quartz or silicon carbide.

A heater 206, being a heating mechanism, is provided outside of the process tube 203, so as to surround a side wall face of the process tube 203. The heater 206 is formed in a cylindrical shape, and is vertically installed by being supported by a heater base 251, being a holding plate.

A manifold 209 is disposed in a lower part of the outer tube 205 concentrically with the outer tube 205. The manifold 209 is made of for example stainless, etc., and is formed in a cylindrical shape with upper end and lower end opened. The manifold 209 is fitted into the lower end portion of the inner tube 204 and the lower end portion of the outer tube 205 respectively, so as to support them. Note that an O-ring 220a, being a seal member, is provided between the manifold 209 and the outer tube 205. By supporting the manifold 209 by the heater base 251, the process tube 203 is set in a state of being installed vertically. A reaction container is formed by the process tube 203 and the manifold 209.

A nozzle 230, being a gas inlet part is connected to a seal cap 210 as will be described later, so as to communicate with inside of the processing chamber 201. A gas supply tube 232 is connected to the nozzle 230. A processing gas supply source and an inert gas supply source, etc., not shown, are connected to an upper stream side of the gas supply tube 232 (opposite side of a connection side to the nozzle 230), via MFC (mass flow control part), being a gas flow rate control unit. A gas flow rate control part 235 is electrically connected to the MFC 241. The gas flow rate control part 235 controls the MFC 241 so that the flow rate of the gas supplied into the processing chamber 201 is a desired flow rate at desired timing.

An exhaust tube 231 for exhausting atmosphere in the processing chamber 201, is provided to the manifold 209. The exhaust tube 231 is disposed at a lower end portion of a cylindrical space 250 formed in a gap between the inner tube 204 and the outer tube 205, so as to communicate with the cylindrical space 250. A pressure sensor 245, for example a pressure adjusting device 242 formed as an APC (Auto Pressure Control part), and a vacuum exhaust device 246 such as a vacuum pump, are connected on a lower stream side of the exhaust tube 231, sequentially from the upper stream side. A pressure control part 236 is electrically connected to the pressure adjusting device 242 and the pressure sensor 245. The pressure control part 236 controls the pressure adjusting device 242 so that the pressure in the processing chamber 201 is set to a desired pressure at desired timing, based on a pressure value detected by the pressure sensor 245.

The seal cap 219, being a throat lid member capable of air-tightly closing the lower end opening of the manifold 209, is provided in a lower part of the manifold 209. The seal cap 219 is brought into contact with the lower end of the manifold 209 from a vertically lower side. The seal cap 219 is for example made of metal such as stainless, etc., and is formed in a disc shape. An O-ring 220b, being a seal member in contact with the lower end of the manifold 209, is provided on an upper surface of the seal cap 219. A rotation mechanism 254 for rotating the boat is provided on the opposite side to the processing chamber 201 in the vicinity of the central part of the seal cap 219. A rotation axis 255 of the rotation mechanism 254 is passed through the seal cap 219 and supports the boat 217 from below. The rotation mechanism 254 is formed so as to rotate the wafer 200 by rotating the boat 217. The seal cap 219 is vertically elevated by the boat elevator 115, being an elevation mechanism vertically installed outside of the process tube 203. The boat 217 can be carried to inside/outside of the processing chamber 201 by elevating the seal cap 219. A drive control part 237 is electrically connected to the rotation mechanism 254 and the boat elevator 115. The drive control part 237 controls the rotation mechanism 254 and the boat elevator 115 so as to perform desired operation at desired timing.

As described above, the boat 217, being a substrate holder, is formed so as to hold a plurality of wafers 200 in a state of being arranged in a horizontal posture, with their centers aligned with one another, in multiple stages. The boat 217 is made of the heat resistant material such as quartz or silicon carbide. A plurality of heat insulating plates 216, being heat insulating members, having disc shapes made of the heat resistant material such as quartz or silicon carbide, are arranged in a horizontal posture in multiple stages, so that heat from the heater 206 is hardly transmitted to the manifold 209 side.

A temperature sensor 263, being a temperature detector, is installed in the process tube 203. A temperature control part 238 is electrically connected to the heater 206 and the temperature sensor 263. The temperature control part 238 adjusts an energization state to the heater 206, so that the temperature in the processing chamber 201 shows a desired temperature distribution at desired timing.

The gas flow rate control part 235, the pressure control part 236, the drive control part 237, and the temperature control part 238 are electrically connected to a main control part 239 that controls an entire body of the substrate processing apparatus. The gas flow rate control part 235, the pressure control part 236, the drive control part 237, the temperature control part 238, and the main control part 239 are formed as the aforementioned MC300.

(1-5) Operation of the Processing Furnace

Subsequently, a method of forming a film on the wafer 200 by using the processing furnace 202 with this structure will be described as one step of the manufacturing steps of the semiconductor device, with reference to FIG. 8. Note that in the description hereafter, the operation of each part that constitutes the substrate processing apparatus is controlled by the MC300.

When a plurality of wafers 200 are charged into the boat 217, as shown in FIG. 8, the boat 217 holding the plurality of wafers 200 is elevated by the boat elevator 115 and is loaded into the processing chamber 201. In this state, the seal cap 219 is set in a state of sealing the lower end of the manifold 209 via the O-ring 220b.

The inside of the processing chamber is vacuum-exhausted by the vacuum exhaust device 246, so as to be a desired pressure (vacuum degree). At this time, (opening degree of a valve) of the pressure adjusting device 242 is feedback-controlled, based on a pressure value measured by the pressure sensor 245. Further, the inside of the processing chamber 201 is heated by the heater 206 so as to be a desired temperature. At this time, the enegization amount supplied to the heater 206 is feedback-controlled based on a temperature value detected by the temperature sensor 263. Subsequently, the boat 217 and the wafer 200 are rotated by the rotation mechanism 254.

Subsequently, the gas supplied from the processing gas supply source and controlled to be a desired flow rate, is introduced into the processing chamber 201 from the nozzle 230 by circulating through the gas supply tube 232. The introduced gas rises through the processing chamber 201, then is flown out into the cylindrical space 250 from the upper end opening of the inner tube 204, and is exhausted from the exhaust tube 231. The gas is brought into contact with the surface of the wafer 200 when passing through the processing chamber 201, and at this time, a thin film is deposited on the surface of the wafer 200 by thermal CVD reaction.

When previously set processing time is elapsed, inert gas is supplied from an inert gas supply source, and inside of the processing chamber 201 is replaced with the inert gas, and the pressure in the processing chamber 201 is returned to a normal pressure.

Thereafter, the seal cap 219 is descended by the boat elevator 115, and the lower end of the manifold 209 is opened, and the boat 217 holding the processed wafer 200 is unloaded to outside of the process tube 203 from the lower end of the manifold 209. Thereafter, the processed wafer 200 is taken out by the boat 217 and is stored in the pod 110 (wafer discharge).

(1-6) Structure of the MC300

Next, details of the MC300 shown in FIG. 1 will be described. The MC300 is constituted of the MC300A and the MC300B.

(Structure of the MC300A)

Figure 2:
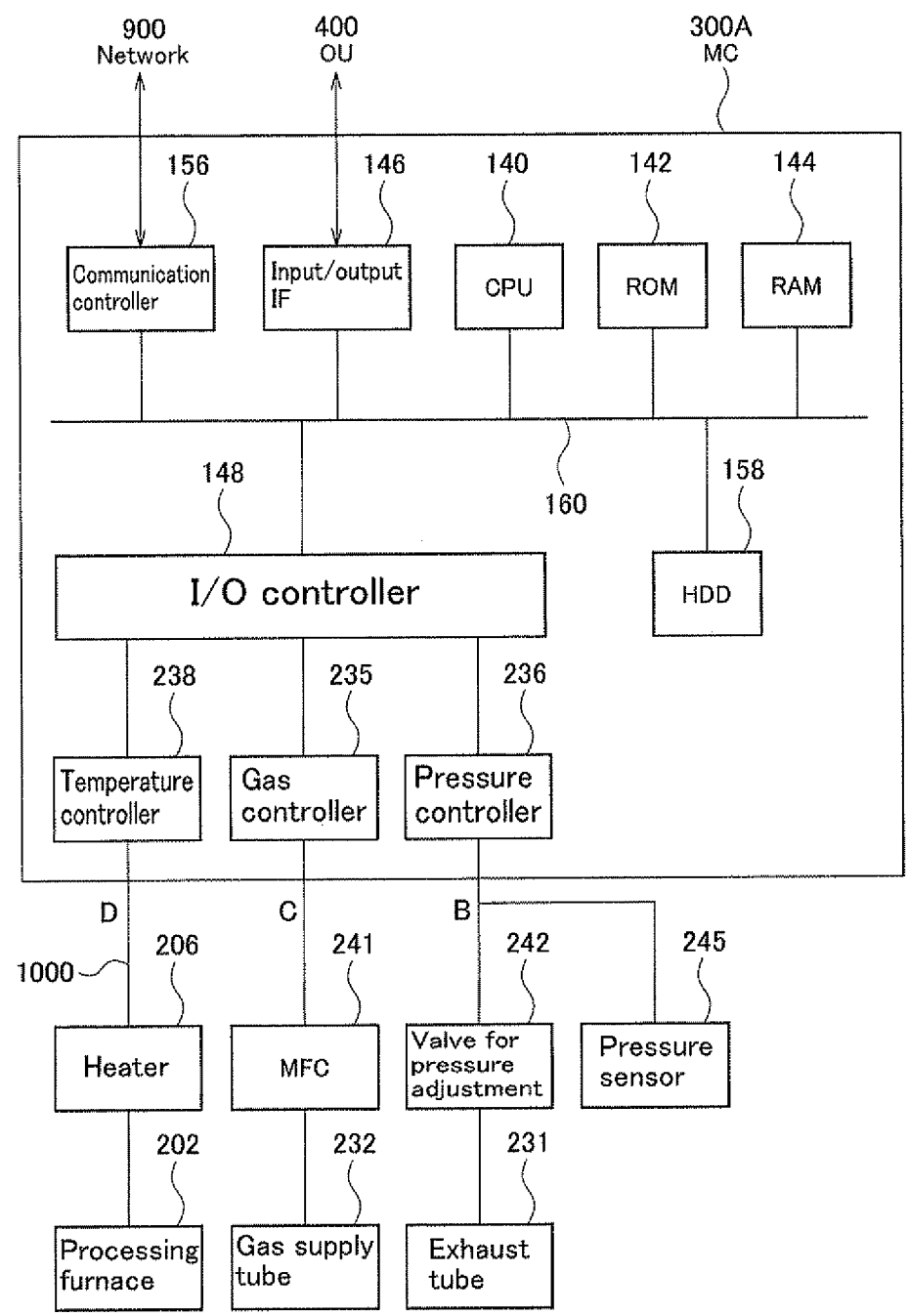
FIG. 2 is a block diagram of a module control part (MC) according to an embodiment of the present invention.

FIG. 2 shows a hardware structure with the MC300A for controlling temperature, gas, pressure, as a center. The MC300A includes CPU140, ROM (read-only memory) 142, RAM (random-access memory) 144, input/output interface (IF) that performs transmission/reception of data to an input/output device, a temperature control part 238, a gas control part 235, a pressure control part 236, and an I/O control part 148 that performs I/O control to the temperature control part 238, etc., a communication control part 156 for controlling data communication to an OU (Operation Unit) 400, being an external computer, via the ordinary network 900, and a hard disc drive (HDD) 158 that stores data. These constituent elements are connected to each other via bus 160, and the data is transmitted and received to/from the constituent elements.

In the MC300A, the CPU140 controls the device to process the wafer, based on the recipe transmitted from the HOST600 via HU500, OU400 or OU400. Specifically, the CPU140 outputs control data (control command) to the temperature control part 238, the gas control part 235, and the pressure control part 236. Sequence programs and data, etc., inputted via the communication control part 156 are stored in the ROM 142, RAM 144, and HDD 158.

The temperature control part 238 controls the temperature in the processing chamber 201 by the heater 206 provided on an outer peripheral part of the processing furnace 202. The gas control part 235 controls a supply amount, etc., of the reaction gas supplied into the processing chamber 201 based on an output value from the MFC (Mass Flow Control part) 241 provided in the gas supply tube 232 of the processing furnace 202. The pressure control part 236 controls the pressure in the processing chamber 201 by opening and closing the valve 242 for adjusting the pressure based on the output value of the pressure sensor 245 provided to the exhaust tube 231 of the processing furnace 202. Thus, the temperature control part 238, etc., controls each component (heater 206, MFD 241, and valve 242, etc.) of the substrate processing apparatus 100 based on the control command from the CPU140.

(Structure of the MC300B)

Figure 3:
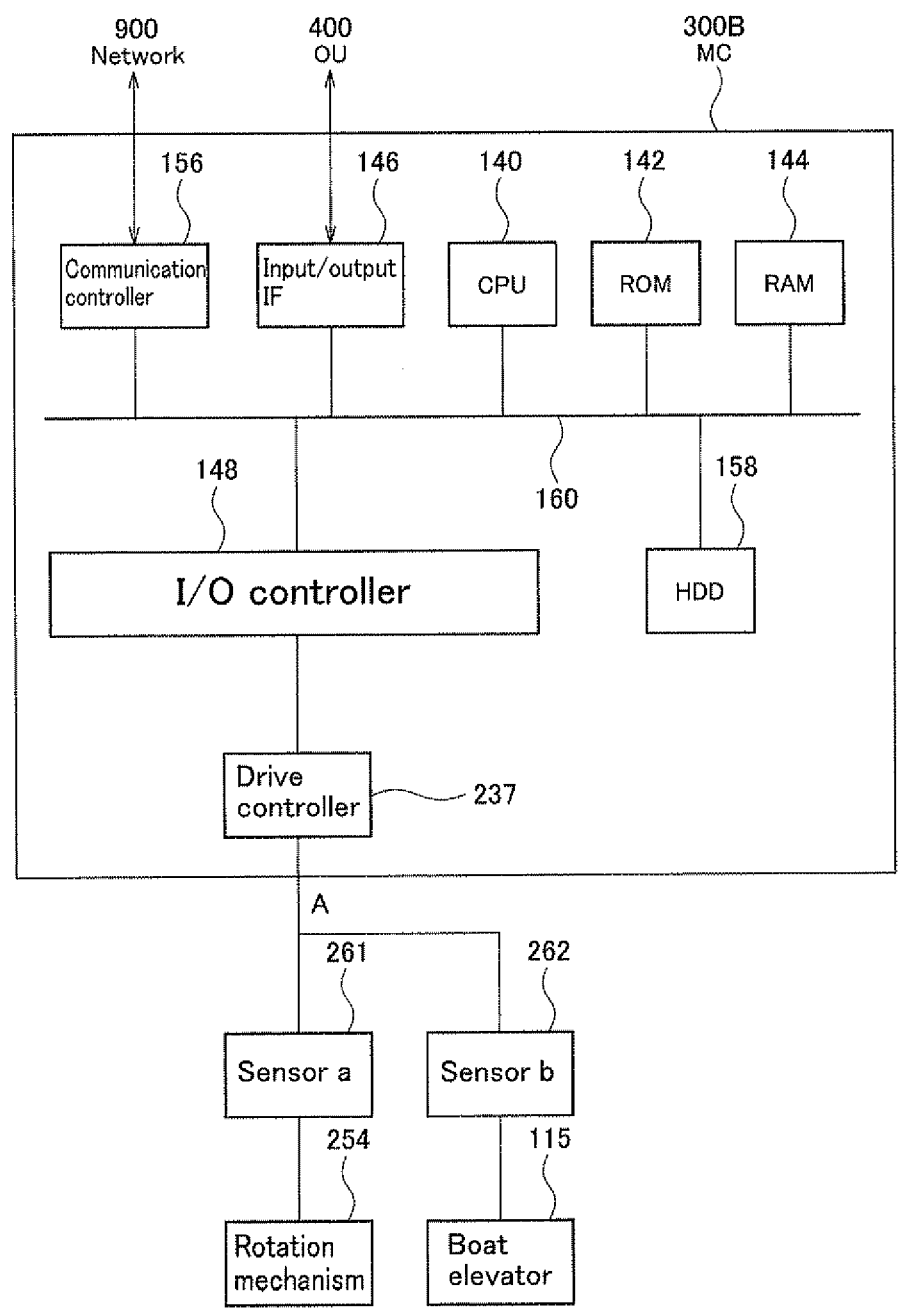
FIG. 3 is a block diagram of a module control part (MC) according to an embodiment of the present invention.

FIG. 3 shows the hardware structure with the MC300B for controlling the drive part, as a center. The hardware structure of FIG. 3 is the same as that of FIG. 2 excluding a point that a control part and a control component are different, and the same signs and numerals are assigned to the same part and explanation therefore is omitted. The drive control part 237 controls rotation of the boat 217 and elevation of the boat 217 by sensor a261 and sensor b262 provided to the rotation mechanism 254 and the boat elevator 115 of the processing furnace 202.

When the data of the recipe is transmitted from the HOST600, the data is inputted into the MC300A and the MC300B via the communication control part 156. The CPU140 starts the sequence program and calls the command of the transmitted recipe in accordance with the sequence program, to thereby sequentially execute the step in which a target value, etc., of a control parameter is set, and the control command for processing the substrate is transmitted to the temperature control part 238, the gas control part 235, the pressure control part 236, and the drive control part 237, via the I/O control part 148. The temperature control part 238, etc., controls each component (heater 206, MFC 241, valve 242, and rotation mechanism 254, etc.) in the substrate processing apparatus 100 in accordance with the control command. Thus, processing is applied to the wafer 200.

(1-7) Structure of the CU700

Figure 4:
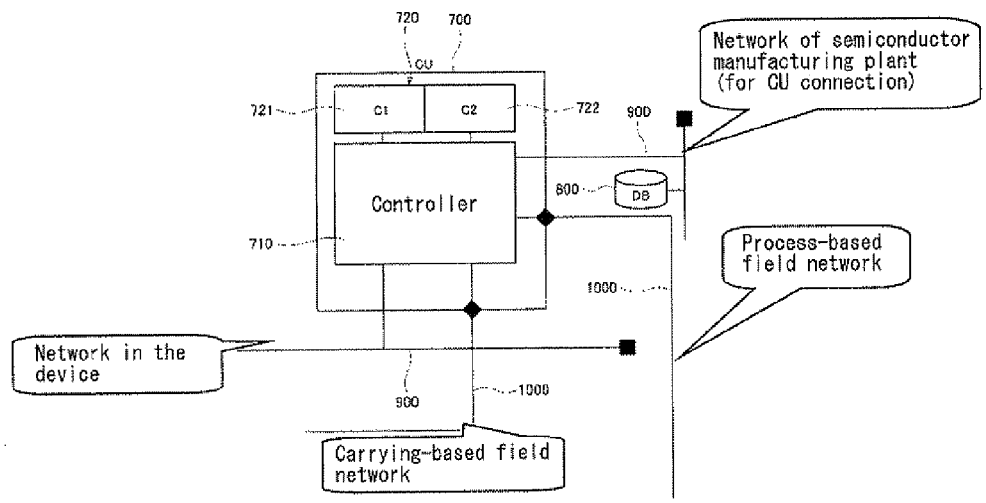
FIG. 4 is a block diagram of a collecting unit (CU) according to an embodiment of the present invention.

FIG. 4 shows a hardware structure with the CU700 for collecting data and temporarily storing (accumulating) it therein, as a center. The CU700 automatically acquires the data (temperature, gas flow rate, pressure, and drive control data, etc.) of various components from the substrate processing apparatus 100 and stores it therein. The CU700 includes a control part 710 and a storage part 720. The control part 710 is interposed between networks 900, 100, and the storage part 720, so as to write the data transmitted from the network 900 into the storage part 720, read the data stored in the storage part 720, and send the data to the network 900. The data transmitted from the device via the network 900 is automatically collected into the storage part 720. Note that the control part 710 performs control to process a request from the DB800 and send data to the DB800, and does not give a request to the device side. Note that in this embodiment, although the CU700 is described separately from the HU500, it may be integrally formed with the HU500.

(1-8) Report of Collected Data

In a substrate processing system of this embodiment as shown in FIG. 1, when the collected data is reported to the HOST600 and the DB800, by using the CU700 not directly affecting the control, there is a problem as follows.

In the substrate processing system, when an exceptional case (abnormality) occurs, required reactive operation is performed. For example, next operation needs to be performed due to a certain event, and in a case of the exceptional case (abnormality), operation such as stopping the system needs to be performed. Further, generation order of trace data, event data, exceptional (abnormal) data, needs to be accurately controlled, and therefore such data needs to be collected to one place of the system (CU700 in this embodiment).

However, it is difficult to achieve highly precise and highly frequent data transmission, while controlling the generation order of the control data, event data, exceptional (abnormal) data. For example, adequate collection frequency required for control is different depending on the component and the kind of data, and the collection frequency is about one/seconds to one/500 msec in many cases. Further, data is collected sometimes with collection frequency of $1/100$ ms or less. However, such a collection frequency is absolutely the collection frequency required for control, and usually the collected data stays within inside of the module control part MC300. When such highly precise and highly frequent (dense collection frequency) data is transmitted to the semiconductor manufacturing plant side, processing time required from collecting data to transmitting data is tremendously increased, resulting in a load added on the system.

Here, this embodiment involves a problem that time lag is generated. Namely, data passing through the MC300 and the OU400 is also passed through the network 900, and is transferred based on the program, and therefore there is no currency of data, thus allowing temporally delay of about several 100 msec to be generated. Incidentally, here, the time of each control part (MC300, OU400, and CU700) is synchronized as precisely as it needs to be, in the substrate processing system.

(1-9) Behavior of Generating Time Lag

Figure 5:
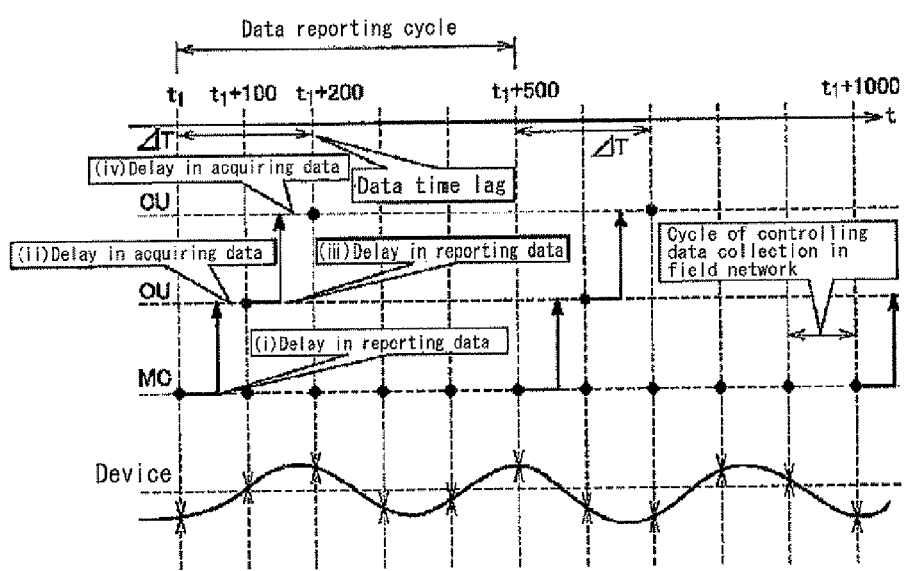
FIG. 5 is an explanatory view showing a collection timing and a delay of data according to an embodiment of the present invention.

Details of the time lag will be described by using FIG. 5. FIG. 5 is a timing view showing data collecting timing and delay.

In FIG. 5, the horizontal axis shows time axis, wherein time is started from t1 and markings are added at 100 msec intervals. The CU data on an uppermost line is the data collected via the MC300, being a control unit. The MC300 acquires component data that flows to the field network 1000 at a field network collecting control cycle (for example, 100 msec) (MC♦).

Data reporting of MC→OU is carried out for example at one/500 msec, for maintaining the control cycle. In the MC300, delay from receiving data to transferring data ((i) delay in reporting data) is generated. The delay in reporting data of (i) is generated for the reason as follows. In the MC300, when the data is acquired, related internal control is prioritized, and thereafter if the timing is matched with a cycle of reporting to the OU400, the data is transmitted to the network. However, at this time, delay is generated by accumulation of the delay generated by the internal control and the delay from inputting into a buffer for transmission to actually transmitting the data.

In the OU400, delay from receiving data to processing data ((ii) delay OU● in acquiring data), and delay from receiving data to transferring the data to the CU700 ((iii) delay in reporting data) is generated. (ii) The delay in acquiring data is generated for the reason as follows. In the OU400, the data received from the network 900 is transferred to a required program. However, the received data can be processed for the first time at a spare time, based on the program thus received. The delay is the time until the received data can be processed. (iii) The delay in reporting data is generated for the reason as follows. In the OU400, data is transmitted to the CU700 via the network. However, at this time, delay from inputting into a buffer for transmission, to actually transmitting the data is accumulated, thus generating the delay. In the CU700, delay from receiving data to processing data is generated like ((iv) delay Cu● in acquiring data). The delay in acquiring data of (iv) is generated for the same reason as the reason for generating the delay in acquiring data of (ii). Then, such a delay is the time lag that occurs in data generating time. Further, the internal control of the MC300A is related to the control of processing the wafer 200, thus increasing data amount and extremely easily allowing the delay to occur. Meanwhile, the MC300B is related to the control of a transfer mechanism such as carrying the wafer 200 and carrying a carrier in which the wafers 200 are stored, and the data amount is relatively small if compared with the MC300A. Accordingly, even when the data is simultaneously generated, the time lag is generated by the time when the data reaches the CU700, regarding the data passing through the MC300A and the MC300B.

Particularly, event data (loading of carrier, unloading of carrier, start of RUN, and end of RUN, etc.) and exceptional data (abnormal temperature and abnormal pressure) is controlled by the MC300. Accordingly, even if the data accumulated in the HOST600 and the DB800 is analyzed, it is difficult to analyze data suitably because the delay is generated in each unit, because the time lag occurs.

(2-1) Data Reporting System

A data reporting (transmitting) system in this embodiment is a system of accumulating data once in the buffer (temporary storage unit) after the data is received by the CU700. Collecting time (time data) is absolutely added to the data, and therefore when the data is accumulated, such a collecting time is utilized. Namely, the data is time-sequentially sorted at last in the buffer based on the time data accompanied with the data. Note that the time data is added when the data is received by each unit (MC300, OU400, etc.).

(2-2) Software Structure in CU

Figure 9:
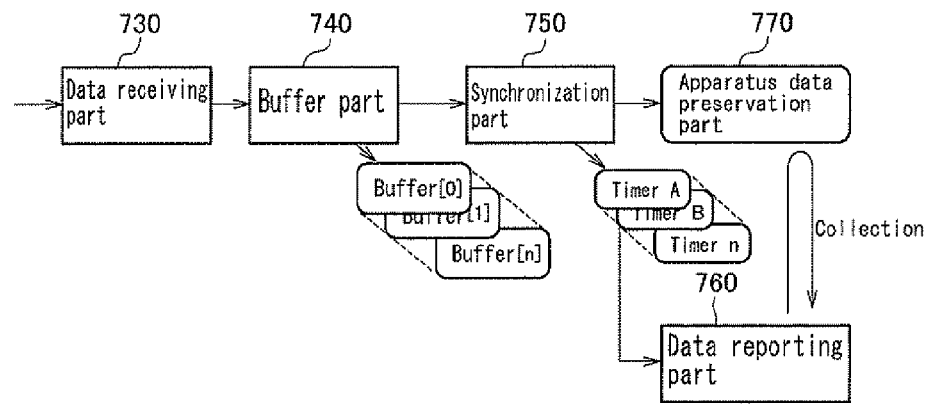
FIG. 9 is a software block diagram in the collecting unit (CU) according to an embodiment of the present invention.

FIG. 9 is a view showing a control device of the substrate processing system according to this embodiment, for example, showing a function structure of the control program (software) executed by the control part 710 of the CU700. As shown in FIG. 9, the control program includes a data receiving part 730, a buffer part 740, a synchronization part 750, and a data reporting part 760. The buffer part 740 can have a plurality of buffers like buffer [0], buffer [1] . . . buffer [n]. The synchronization part 750 includes a plurality of timers like timer A, timer B, . . . timer n. An apparatus data preservation part 770 is realized by a memory in the CU700. The processing of each function structure will be described hereafter.

(2-3) Data Receiving Part

The data receiving part 730 shapes time data as needed, and transfers it to the buffer part 740. For example, the data passing through the MC300 and the OU400 is formed based on a variable length format including time data.

(2-4) Buffer Part

Figure 10:
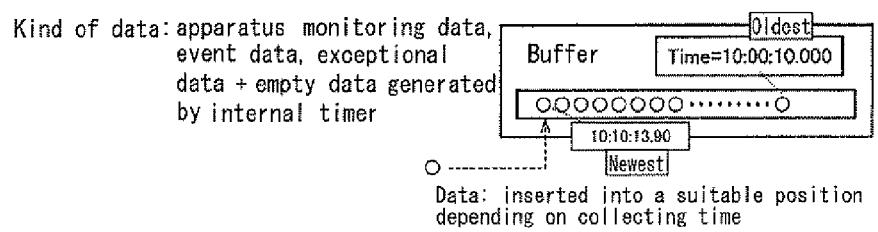
FIG. 10 is an explanatory view of inserting data into a buffer according to an embodiment of the present invention.

The buffer part 740 temporarily stores the shaped data. As the kind of the data transmitted to the buffer part 740, apparatus monitoring data including various control data, event data, exceptional data, and empty data generated by internal timers as will be described later, can be given for example. Note that in this embodiment, as shown in FIG. 10, the data is inserted into a suitable position in the buffer in accordance with a collecting time order.

Further, in order to accurately process the data remained in the buffer even when the data is not received, empty data for treating only time in the collecting unit CU700 is added into the buffer regularly (for example, for every 0.5 seconds). Such empty data adding process is performed by the internal timers provided in the buffer. A regular time needs to be set by grasping a suitable value in consideration of a case that excessively short time results in adding load on the system and an increase in a buffer capacity, and excessively long time results in reduced data reporting frequency as will be described later in some cases.

Here, the buffer has an ability of holding data for a constant time. Constant time $T_B$ is set based on a maximum delay time from collecting data by the MC300, etc., to transmitting the data to the CU700. The constant time $T_B$ is assumed to be when the maximum delay time is 3 seconds and therefore is set to 1 second, and 4 seconds in total. The maximum delay time is different depending on the ability of the system, and therefore a suitable value needs to be grasped and set. The delay time in the system is absorbed by the buffer. Namely, the maximum value of the data delay time in the system according to this embodiment, is determined by the buffer length. In this embodiment, although delay of constant time $T_B$ (4 seconds) occurs, the data can be orderly rearranged in an order of the time data. Accordingly, reliability of the data analysis in a host computer is improved. Note that the host computer may have the function of rearranging data based on time.

Figure 11:
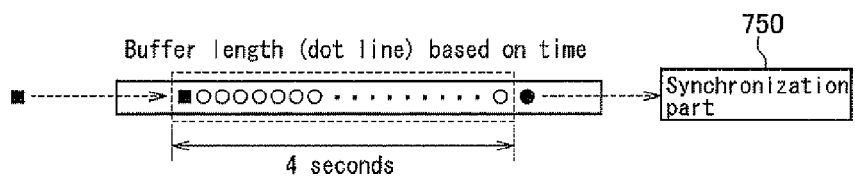
FIG. 11 is an explanatory view of inserting data into a buffer according to an embodiment of the present invention.

As shown in FIG. 11, the buffer length (4 seconds) based on time is shown by dot line. In a case of a full data holding ability in the buffer, when new data is received and is inserted into the buffer, the holding ability of the buffer exceeds the constant time $T_B$, and therefore old data of a portion exceeding the time $T_B$ is outputted (black round marks) from the buffer, from added new data (black square) in the data shown by round white marks, and is sent to the synchronization part 750.

(2-5) Data Reception Flow

Figure 12:
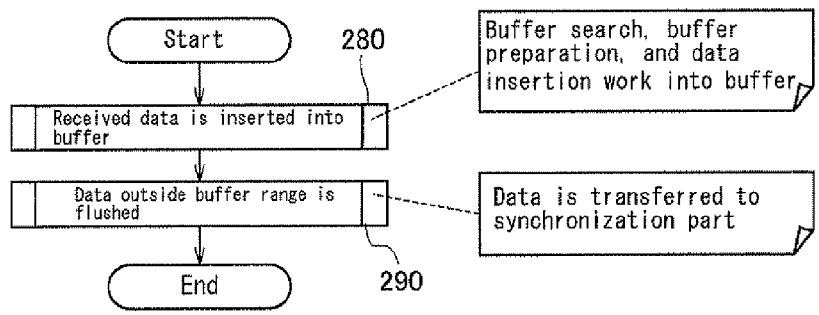
FIG. 12 is a flowchart of receiving data according to an embodiment of the present invention.

FIG. 12 shows a conceptual flow of data reception by the buffer part 740.

When the data is received, the buffer part 740 of the control program inserts the received data into the buffer (step 280), and flushes the data outside of a buffer range (step 290). In step 280, search of a plurality of buffers, preparation of a new buffer, and data insertion process into the buffer are executed.

Here, the data outside of the buffer range means the data exceeding the constant time $T_B$ controlled in the buffer. Further, flush in this embodiment means transfer of the data to the synchronization part and transmission of the data to a specified transmitting destination.

Next, the aforementioned "insertion of the received data into the buffer" and "flush of the data outside of the buffer range" will be specifically described.

(2-6) Insertion of the Received Data into the Buffer

Figure 13:
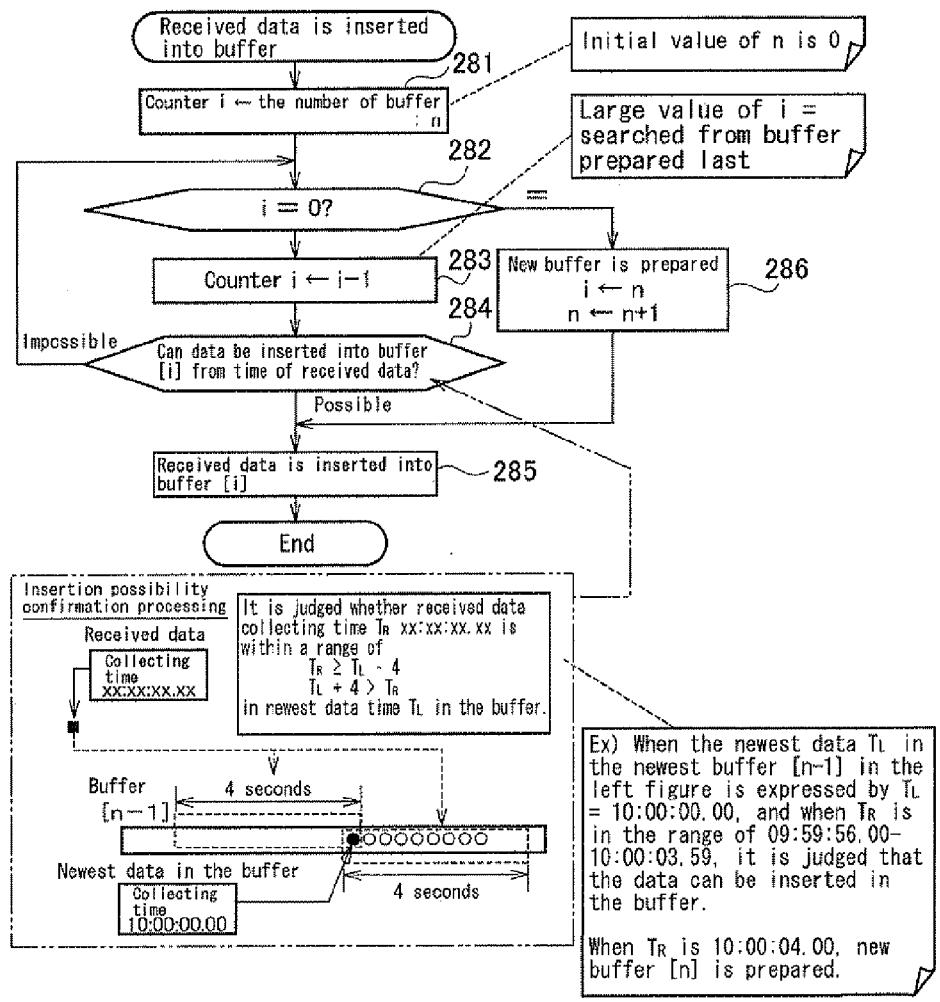
FIG. 13 is a flowchart of receiving data according to an embodiment of the present invention.

Content of inserting data into the buffer executed by the buffer part 740 in step 280 (FIG. 12) will be specifically described by using FIG. 13.

The number of buffers "n" is set by counter "i" (step 281). An initial value of n is "0". After n is set, whether i=0 is determined (step 282), and when i=0, a new buffer is prepared, and "n" is set by the counter i, and "n+1" is set for n (step 286), and processing is advanced to insertion step 285 as will be described later. If i is not "0", "i−1" is set by the counter i (step 283) In this case, a large value of i is searched from a last prepared buffer. After "i−1" is set, whether data can be inserted into the buffer [i] is determined based on the time of receiving data (step 284), and when the data can not be inserted, the processing is returned to step 282. When the data can be inserted, the received data is inserted into the buffer [i] (step 285), and the insertion flow is ended.

The step 284 will be specifically described by using the explanatory view showing an insertion possibility confirmation processing content surrounded by one dot chain line.

Collecting time $T_R$ of received new data (black square) is assumed to be xx:xx:xx. xx.

The constant time showing a data holding ability of the buffer is expressed by $T_B$=4 seconds, and therefore with respect to a newest data collecting time $T_L$ in the buffer, when data collecting time $T_R$xx:xx:xx. xx is 4 seconds before the collecting time $T_L$ or when the data collecting time $T_R$xx:xx: xx, xx does not exceed 4 seconds or more from the collecting time $T_L$, it is judged that the data can be inserted into the buffer. Namely, the buffer part 740 judges whether received data collecting time $T_R$ is within a range of:

$$T_R \geq T_L - 4$$

$$T_L + 4 > T_R$$

and when the received data collecting time $T_R$ is within this range, it is judged that the data can be inserted into the buffer.

For example, when newest data (black round mark) in the newest buffer [n−1] is expressed by $T_L$=10:00:00.00,
$T_L$−4=10:00:00.00−00:00:04.00=09:59:56.00
$T_L$+4=10:00:00.00+00:00:04.00=10:00:04.00 is established. Therefore, when the collecting time $T_R$ is within a range of 09:59:56.00 to 10:00:03.59, the buffer part 740 judges that the received new data can be inserted into the buffer [n−1]. When the received data collecting time $T_R$xx:xx:xx. xx is later than the collecting time 10:00:00.00 of the newest data in the buffer, the received data (black square) is inserted into the buffer (length: 4 seconds) after the newest data (black round mark) in the buffer. When the received data collecting time $T_R$xx:xx:xx. xx is earlier than the collecting time 10:00:00.00 of the newest data in the buffer, the received data (black square) is inserted into the buffer (length: 4 seconds) before the newest data (black round mark) in the buffer. Thus, in the processing of confirming the possibility of inserting data into the buffer, a range before 4 seconds to after 4 seconds is included in the newest data. Therefore, the range possible to insert data into the buffer, regarding the newest data of each buffer, has a width of $2 \times T_B$ (4 seconds). Namely, in the processing of storing data in the buffer, whether data can be stored is judged by the time $2 \times T_B$ of each buffer portion.

Note that when the received data collecting time $T_R$ is 10:00:04:00, the received data collecting time $T_R$ exceeds the time $2 \times T_B = 8$ seconds, and therefore new buffer [n] is prepared.

Incidentally, in the processing of confirming the possibility of inserting data into the buffer, the buffer has a width of $2 \times T_B$ of each buffer portion, and therefore there is a possibility that overlaps occur in the time controlled by buffers. Therefore, in this embodiment, time overlaps in data are excluded as described in the following (A) and (B), so that overlaps don't occur in the time controlled by the buffers.

(A) Processing Example When New Buffer is Temporally New

Figure 14:
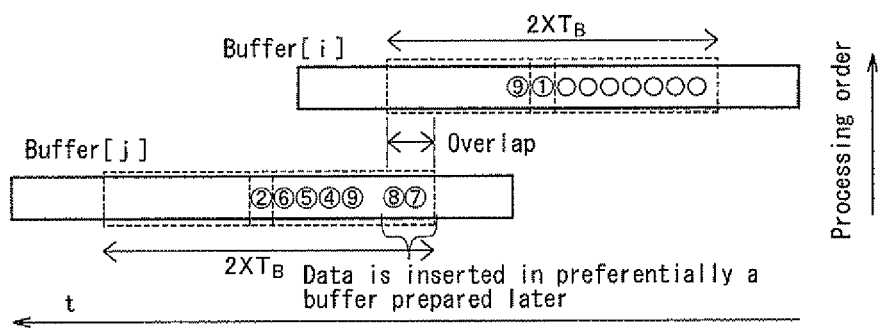
FIG. 14 is an explanatory view showing an overlap of a buffer control time according to an embodiment of the present invention.

Explanation will be given based on FIG. 14. Note that circled number in FIG. 14 shows number in parentheses for convenience. The same thing can be said for FIG. 15 and FIG. 18 as will be described later.

It is assumed that data (2) is received when data (1) of buffer [i] is set in a newest state. When this collecting time is newer than the collecting time+$T_B$ of data (1), buffer [j] is prepared, and data (2) is stored in the buffer [j]. Thereafter, it is assumed that data (3) to (8) are stored before (collecting time is older) data (2) in the buffer [j]. In this case, even if the data (7) and (8) are in a range possible to store data in the buffer [i], the processing of storing data in the buffer [j] is prioritized. Thereafter, it is assumed that data (9) is received. When the collecting time of the data (9) is older than the collecting time $-T_B$ of data (2) in the buffer [j], and newer than the collecting time of data (1) in buffer [i], the data is stored in the buffer [i]. In this case, all data in the overlap portions are stored in the new buffer [j], and therefore contradiction on data control does not occur.

(B) Processing Example when the New Buffer is Temporally Old

Figure 15:
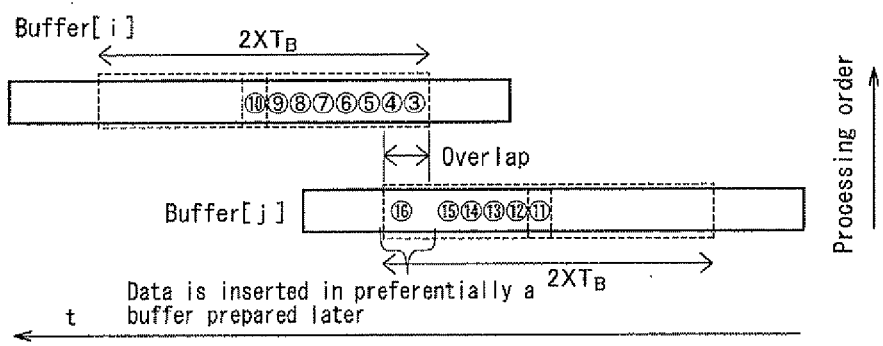
FIG. 15 is an explanatory view showing an overlap of a buffer control time according to an embodiment of the present invention.

Explanation will be given based on FIG. 15.

It is assumed that data (11) is received when data (10) of the buffer [i] is in a newest state. When this collecting time is older than the collecting time $-T_B$ of data (10), buffer [j] is prepared, and data (11) is stored in the buffer [j]. Thereafter, it is assumed that data (12) to (16) are stored after data (11) (collecting time is newer) in the buffer [j]. In this case, even if the data (16) is in a range possible to store data in the buffer [i], the processing of storing data in the buffer [j] is prioritized. In this case, data (3), (4) of the buffer [i] are stored at a position temporally overlapped with data (16) of the buffer [j], and seems to be inconsistent on controlling data. However, actually, the data (16) is the temporally newly received data, and after elapse of time of about $T_B$ after flushing data (3), (4) which are received before, the data (16) is flushed. As will be described in the next page, in the flush processing, data of $T_B$ portion in all buffers is remained, and other data is flushed. Therefore, the aforementioned temporally overlap of data is controlled while always excluding the overlaps. Accordingly, data inconsistency on data control does not occur.

(2-7) Flush of Data Outside the Buffer Range

Figure 16:
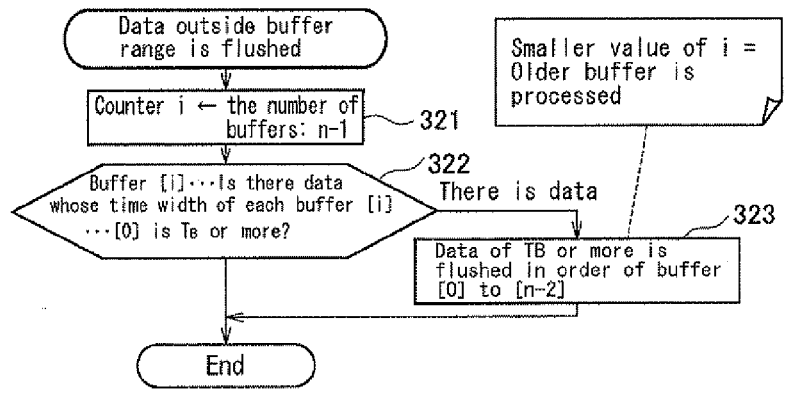
FIG. 16 is a flowchart of receiving data according to an embodiment of the present invention.

Content of flush of step 290 (FIG. 12) executed by the buffer part 740 will be specifically described by using FIG. 16.

The number of buffers n-1 is set by counter i (step 321). After setting, presence/absence of the data is judged, whose total time widths in each of the buffers [i] . . . [0] is $T_B$ seconds or more (step 322), and when such data is absent, the processing is ended without flush. When such data is present, data of $T_B$ or more is flushed in an order from buffers [0] to [n-2] (step 323), and processing is ended. In step 323, processing is applied to a smaller value of i, namely, older buffer. [0] is an oldest buffer.

Next, temporally range of buffer control in the flush will be described.

First, a first specific example will be described by using FIG. 17.

Figure 17:
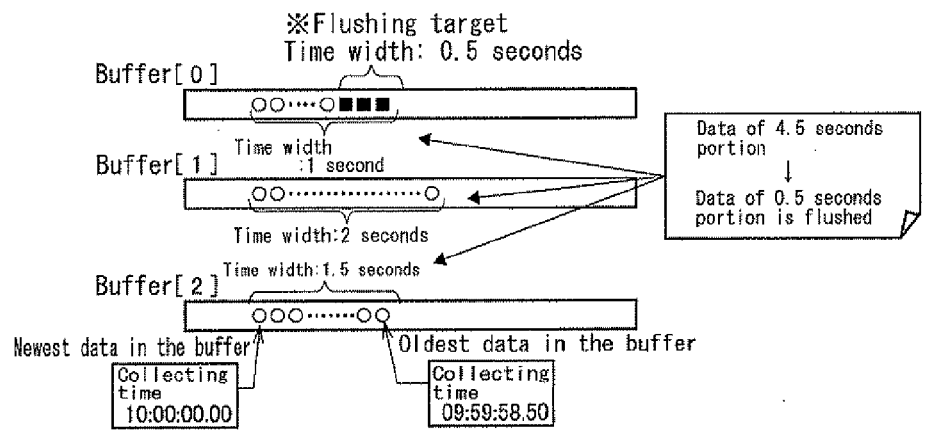
FIG. 17 is an explanatory view showing a time range of a buffer control according to an embodiment of the present invention.

As shown in FIG. 17, it is assumed that there is a state that three buffers ([0] to [2]), exist, and also it is assumed that the time width between the newest data and the oldest data in buffer [0] is 1 second, and similarly in a case of buffer [1], the time width is assumed to be 2 seconds, and in a case of buffer [2], the time width is assumed to be 1.5 seconds (the collecting time of the newest data in the buffer is 10:00:00.00, and the collecting time of the oldest data in the buffer is 09:59:58.50). In this case, data time of total buffers is 4.5 seconds, and it is found that the data of surplus exists in 0.5 seconds that come off from $T_B$ in the oldest buffer [0], compared with a case of $T_B=4$ seconds. Data of such a surplus is shown by black squares, and such data becomes a flush target.

In the above processing of storing data in the buffer, whether data can be stored is judged by time $2 \times T_B$ of each buffer. However, all buffers are controlled by time $T_B$. Thus, control time $T_B$ of total buffers can be maintained so that data transmission to the synchronization part 750 can be continued without interruption.

Figure 18:
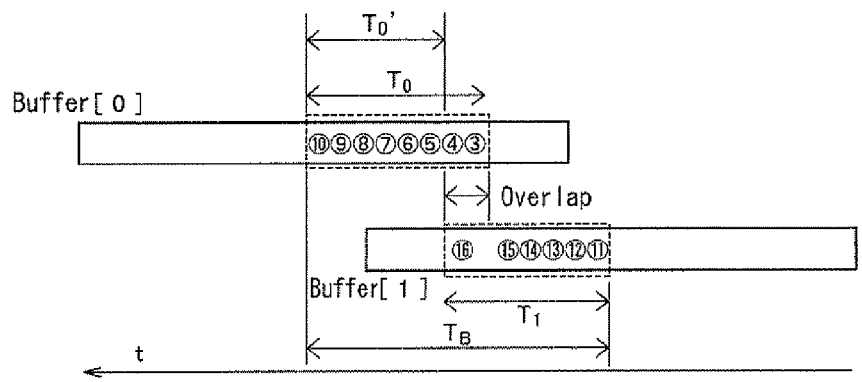
FIG. 18 is an explanatory view showing the time range of the buffer control according to an embodiment of the present invention.

Further, a second specific example will be described by using FIG. 18. In a specific example shown in FIG. 18, similarly to FIG. 15, it is assumed that only two buffers exist. When control time range of buffer [i]=buffer [0] is $T_0$, and control time range of buffer [j]=buffer [1] is $T_1$, $$T_0 \leq 2 \times T_B$$

$$T_1 \leq 2 \times T_B$$

is satisfied immediately before performing processing of "data outside of the buffer range is flushed".

Here, when flush processing described by using FIG. 16 and FIG. 17 is applied, data time that can be remained in buffer [0] is expressed by $$T_0' = T_B - T_1,$$

and data of time portion ($T_0 - T_0'$) (data (3) and (4) here) is pushed out. When time data of data (11), whereby buffer [1] is prepared, is taken into consideration, time range of data (10), (11) is $T_B$ or more, and therefore such old data (3), (4) becomes the flush target.

First, even when the received data is not transmitted, empty data is added for every constant time (for example, for every 0.5 seconds), so that the data in the buffer is accurately processed. Such empty data is added in accordance with the aforementioned processing flow.

In the processing flow, as described above, a new buffer is prepared when the collecting time $T_R$ of the received new data exceeds $2 \times T_B$ of each buffer and can not be stored in any one of the buffers. Usually, the new buffer is prepared when time variation occurs, and the number of buffers is only 2 if times of all units are synchronized within a constant time $T_B$ (4 seconds). If the number of buffers is 3 or more, time $T_B$ may be readjusted. However, basically improvement is desired regarding the time synchronization among units and delay in data transfer processing.

Figure 24:
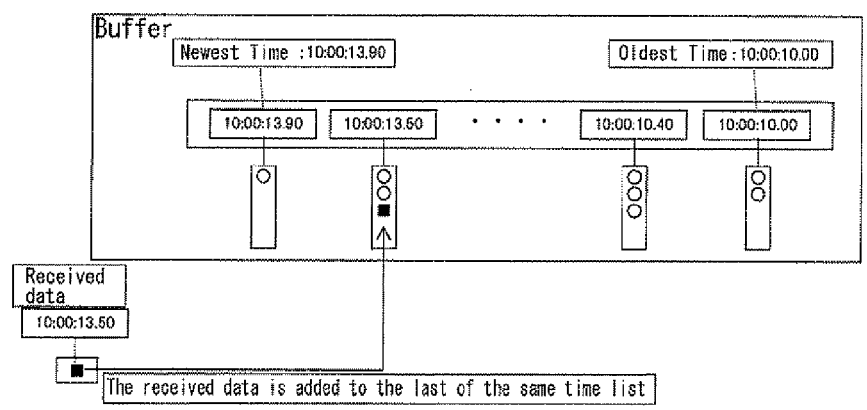
FIG. 24 is an explanatory view of a buffer part according to other embodiment of the present invention.

Further, a third specific example will be described by using FIG. 24. In the system of FIG. 24, data is not directly accumulated in the buffer, and data having the same time (same time data) is controlled by a list, and the list of the time data is controlled by the buffer. This is because since the MC300 collects a plurality of data at the same time, and therefore a plurality of same times of the data exist. Thus, as shown in FIG. 24, by devising the storage of the data in the buffer part 740, there is an advantage that more efficient insertion processing than the insertion processing of specifying an insertion place by sequentially comparing and searching the time added to the received data and the time added to the data in the buffer, can be performed.

For example, when a plurality of data of the same time are arranged, in the aforementioned storage of the buffer part 740, the time of each data needs to be sequentially compared, and this is inefficient. Here, according to the third specific example, as shown in FIG. 24, when the storage of the buffer part 740 is formed in a time list, accompanied data (time data) and a list control time in the buffer are compared, thus making it possible to exclude redundancy of the same time data. Further, when the data is searched, the search can be more efficiently executed than a sequential search by using a binary search.

(2-8) Synchronization Part

The synchronization part 750 is a module for synchronizing the timing of updating a monitor data preservation area and the timing of collecting trace data, by using a system time (synchronized time) loaded into the synchronization part 750, irrespective of the system time of the CU700. The process of the synchronization part 750 will be described hereafter by using FIG. 19.

Figure 19:
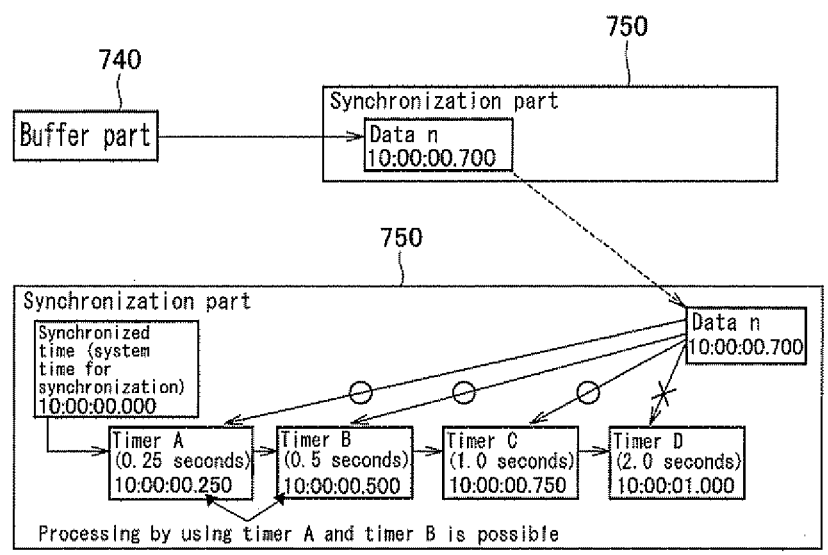
FIG. 19 is an explanatory view of a synchronization part according to an embodiment of the present invention.

As shown in FIG. 19, the synchronization part 750 is started by a timer, and when there is data n transmitted from the buffer part 740, the synchronization part 750 checks the time of the data (10:00:00. 700). This check clarifies which of the timers A(0.25 seconds), B(0.5 seconds), C(1.0 seconds) that exist in the synchronization part 750 can generate the timing between the time (10:00:00. 700) and the system time (synchronized time (10:00:00. 000)) in the synchronization part 750. Note that "n" of data n means a name of the data, and for example, means a temperature or a pressure. Further, time intervals of reporting data are generated by timers A, B, C, D . . . .

In a case of the example shown in the figure, timing can be generated by timers A and B, which are present between the synchronized time (10:00:00. 000) and the time of the data n (10:00:00. 700), and therefore timer processing is generated in an order of the timers A and B. The timer is connected to a trace, etc., of DCP (Data Collection Plan), and data collection or data transmission is performed at such a generated timing. DCP means a plan defined for collecting or setting desired data by a client, and all numbers added to trace data, event, and exceptional processing, and combined information, frequency, etc., are described in the DCP.

Figure 20:
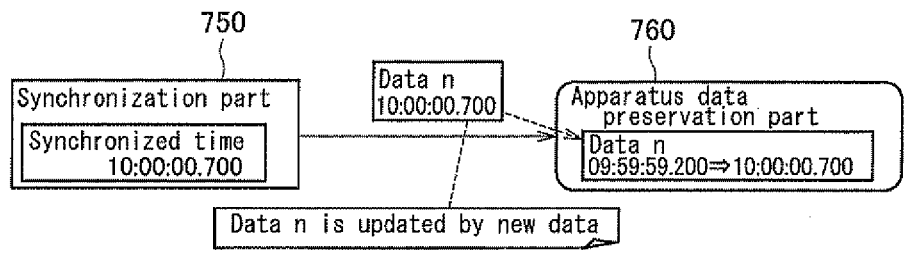
FIG. 20 is an explanatory view of data writing into an apparatus data preservation area from the synchronization part according to an embodiment of the present invention.

As shown in FIG. 20, the timer processing of all times capable of processing is generated by the synchronization part 750, and thereafter the synchronized time is updated to the time of data n (10:00:00. 700), and new data n (10:00:00. 700) is written on data n (09:59:59. 200) of one before in the apparatus data preservation part 760.

(2-9) Data Reporting Part

Figure 21:
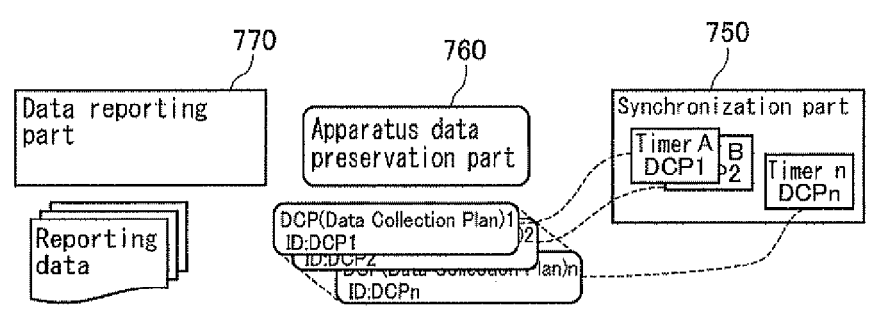
FIG. 21 is an explanatory view of a data reporting part according to an embodiment of the present invention.

As shown in FIG. 21, the data reporting part 770 is started by generating the timing by timers A, B, . . . n which are capable of processing by the synchronization part 750. Related DCP can be identified using ID, etc., by the timers. This is because if the timer has ID, the DCP having the same ID can be discriminated. The data reporting part 770 collects required data described in the DCP from the apparatus data preservation part 760, and prepares and transmits the reporting data.

As described above, data required for reporting is collected, and therefore the data can be transmitted to the DB800 via the ordinary network 900 from the CU700 by inputting the data into a transmission cue in the control part 710 of the CU700.

As described above, the process using the buffer has been described. In this processing system, it appears that the timing of reporting to the DB800, etc., is inaccurate. However, preparation time described in the reporting data is accurately based on the time interval required in DCP. Accordingly, when the data in the DB800 is analyzed finally, data of an accurate time can be acquired without inconsistency in accordance with the individual collecting time in the device system.

(2-10) Packing Data

As described above, highly precise data collection is requested in the device system, and it can be easily assumed that as one of the solving methods thereof, packing data is treated, in which data of a constant time portion out of certain data is packed. According to this embodiment, by inserting the packing data into a position based on each collecting time in the buffer, the data for reporting to the DB can be prepared and reported without inconsistency.

Specific explanation will be given hereafter.

Figure 22:
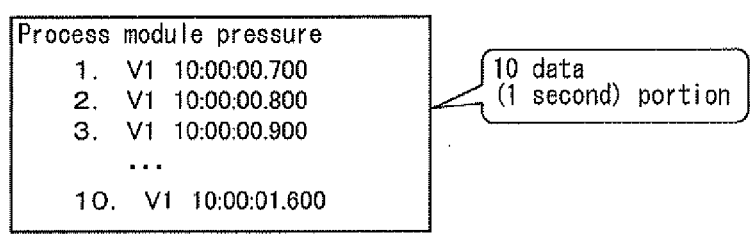
FIG. 22 is an explanatory view of an example of packing data according to an embodiment of the present invention.
Figure 23:
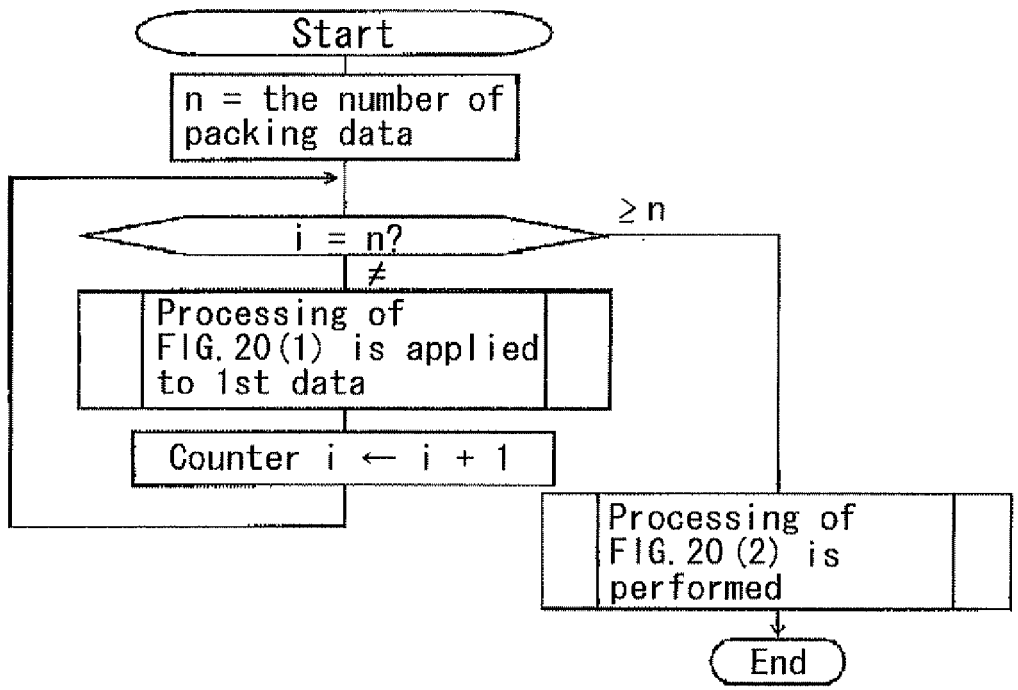
FIG. 23 is a data receiving flowchart of an example of packing data according to an embodiment of the present invention.

FIG. 22 shows an example of data, with data of one second packed, in which 10 data is collected together at intervals of 0.1 seconds in a process module pressure. FIG. 23 shows a data reception flow executed by the buffer part 740 in a case that the packing data and non-packing data are mixed. The buffer part 740 acquires the number n of data packed from the received data, and applies thereto processing 280 of FIG. 12 and inserts the data into the buffer. After insertion of data, counter i is increased. Then, when the counter i is equal to or more than the number n of the packing data acquired from the received data, processing 290 of FIG. 12 is applied thereto, and the data outside of the buffer range is flushed.

(2-11) Effect of This Embodiment

According to this embodiment, generation time of each kind of data can be controlled. Therefore, time lag generated in collected data, can be matched. Accordingly, highly precise and highly frequent data generated at the semiconductor manufacturing device side can be appropriately transmitted to the semiconductor manufacturing device plant side. Further, when event data is simultaneously generated at the end of the recipe or during loading/unloading of the FOUP, being the carrier, a plurality of event data generated simultaneously can not be transmitted simultaneously, and last event data needs to be in a weighting state, compared with first event data, thus allowing the time lag to occur. Further, when transmission of the control data is generated during transmitting each event data, the time lag becomes great. In such a case as well, proper data can be provided by data control according to this embodiment. Further, when analysis of data is performed, regarding data (for example, data accumulated in the DB800) collected during substrate processing by the system at the semiconductor manufacturing plant side, the data with time lag controlled can be utilized. Therefore, precision of data analysis (for example, cause investigation of generated abnormality, or factor survey of abnormal data) is improved.

Note that according to the first and second embodiments, film formation processing is performed as the substrate processing. However, the film formation processing includes CVD, PVD, processing of forming an oxide film or a nitride film, and processing of forming a film including metal. Further, processing such as annealing, oxidizing, nitriding, and dispersing may also be used. Moreover, explanation has been given for a case that the substrate processing apparatus is a vertical apparatus. However, the present invention can also be applied to a single wafer processing apparatus. Further, in addition to the semiconductor manufacturing device, the substrate processing apparatus also includes an exposure device, a coating device, a drying device, and a heating device, etc.

Further, according to this embodiment, a client system such as DB, being a reporting destination, needs not to be disposed on a floor (clean room) similarly to the substrate processing apparatus, and for example, may be disposed in LAN-connected business offices.

Preferred aspect of the present invention will be described hereafter.

There is provided a substrate processing system, comprising:

a substrate processing apparatus constituted of a plurality of components;

a control unit for controlling the substrate processing apparatus based on a control procedure for defining time and each component; and a collecting unit for collecting data from the aforementioned each component, the collecting unit further comprising at least:

a buffer that temporarily stores the collected data; and a sorting part for rearranging the collected data to the time series, based on time data attached to the data stored in the buffer.

Preferably, when the data is not generated from the plurality of components for a prescribed period when the data is collected, the collecting unit stores in the buffer empty data of only the time data.

There is provided a data control method in a substrate processing system comprising a substrate processing apparatus constituted of a plurality of components; a control part for controlling substrate processing based on a procedure of defining each component; and a collecting unit for collecting data generated by each component, from the control unit, wherein the collecting unit stores collected data to the time series, based on attached time data.

There is provided a data control device, comprising:

a collecting unit for collecting data generated when a procedure of defining each component is executed, wherein the collecting unit stores collected data to the time series, based on attached time data.

There is provided a substrate processing apparatus comprising a control unit for executing a procedure of defining each component; and a collecting unit for collecting data generated during execution of the procedure, wherein the collecting unit stores collected data based on attached time data.

Note that in this embodiment, the following additional description is further included in the content.

(Additional Description 1)

There is provided a control system of a substrate processing apparatus, comprising:

a collecting unit for collecting data from each component that constitutes a substrate processing apparatus, the collecting unit further comprising:

a buffer for temporarily storing the data, wherein the data is rearranged to the time series, based on time data attached when the data is stored in the buffer.

(Additional Description 2)

There is provided a control system of a substrate processing apparatus according to additional description 1, wherein when the data is not stored in the buffer for a prescribe period, the collecting unit stores empty data of only the time data, in the buffer.

(Additional Description 3)

There is provided the control system of a substrate processing apparatus according to additional description 1, comprising an operation part that collects data generated by each component, wherein the collecting unit stores the data in the buffer, in an order of the time data attached to the data transmitted from the operation part.

(Additional Description 4)

There is provided the control system of a substrate processing apparatus according to additional description 1, comprising:

an operation part that collects data generated by each component; and a control part for controlling the substrate processing apparatus by operating each component by executing a file for applying prescribed processing to a substrate, wherein the collecting unit stores in the buffer the data transmitted from the operation part in an order of time data, based on the time data attached by the operation part and the control part when data generated by each component is received.

(Additional Description 5)

There is provided the control system of a substrate processing apparatus according to additional description 4, comprising:

a first control part for controlling prescribed substrate processing applied to the substrate; and a second control part for controlling prescribed substrate carrying applied to the substrate;

wherein the collecting unit stores in the buffer the data transmitted from the operation part in an order of time data, based on the time data attached in the first control part and the second control part.

(Additional Description 6)

There is provided the control system of a substrate processing apparatus according to additional description 4, wherein an ability of holding data stored in the buffer is determined by a maximum delay time from collecting data by the control part, to transmitting data to the collecting unit.

(Additional Description 7)

There is provided the control system of a substrate processing apparatus according to any one of the additional descriptions 1 to 6, wherein data stored in the buffer is apparatus monitoring data including various control data, event data, and exceptional data.

(Additional Description 8)

There is provided a collecting unit having a buffer for temporarily storing the data, wherein the data is rearranged to the time series based on time data attached when the data is stored in the buffer.

(Additional Description 9)

There is provided a substrate processing apparatus having a collecting unit for collecting data from each component, the collecting unit further having a buffer for temporarily storing the data, wherein the data is rearranged to the time series, based on time data attached when the data is stored in the buffer.

(Additional Description 10)

There is provided a control method of a substrate processing apparatus comprising a collecting unit for collecting data from each component, the collecting unit further comprising a buffer for temporarily storing the data, wherein the data is rearranged to the time series based on time data attached when the data is stored in the buffer.

(Additional Description 11)

There is provided a control system of a substrate processing apparatus, comprising:

a collecting unit for collecting data from each component that constitutes a substrate processing apparatus; and an operation part that collects data generated by each component, the collecting unit further comprising:

a buffer for temporarily storing the data, wherein the data is rearranged to the time series in the buffer, based on time data attached to the data transmitted from the operation part.

(Additional Description 12)

There is provided a control system of a substrate processing apparatus, comprising:

a collecting unit for collecting data from each component that constitutes the substrate processing apparatus; and a control part for controlling the substrate processing apparatus by operating each component by executing a file for applying prescribed substrate processing to a substrate, the collecting unit further comprising:

a buffer for temporarily storing the data, wherein the data is rearranged to the time series in the buffer, based on time data attached to the data transmitted from the control part.

(Additional Description 13)

There is provided the control system of a substrate processing apparatus according to additional description 11, wherein the control part comprises:

a first control part for controlling prescribed substrate processing applied to the substrate; and a second control part for controlling prescribed substrate carrying applied to the substrate, wherein the collecting unit rearranges the data to the time series in the buffer, based on time data attached to the data by the first control part and the second control part.

(Additional Description 14)

There is provided the control system of a substrate processing apparatus according to additional description 11, wherein the control part operates each component by executing the file and transmits the data to the collecting unit during prescribed substrate processing applied to the substrate, and the collecting unit rearranges the data to the time series in the buffer, based on time data attached by the control part.

(Additional Description 15)

There is provided a collecting unit for collecting data from each component, comprising:

a buffer part for temporarily storing the data;

a synchronization part in which a plurality of timers are set; and a data reporting part having a plurality of plans, wherein the data is rearranged to the time series, based on time data attached when the data is stored in the buffer, the time is synchronized by the time data and the timers, and the data is reported in a format based on the plan.

(Additional Description 16)

There is provided a manufacturing method of a semiconductor device, comprising the steps of:

processing a substrate by controlling a substrate processing apparatus constituted of a plurality of components;

generating data from each component when the substrate is processed; and collecting the generated data, wherein in the step of collecting, a buffer for temporarily storing the data is provided, and the data is rearranged to the time series, based on time data attached when the data is stored in the buffer.

What is claimed is:

1. A control system for high frequent data collection between at least one of a host and a database of a semiconductor manufacturing plant side and a substrate processing apparatus having a plurality of components, the control system comprising:

a collecting unit configured to collect data generated in each component of the substrate processing apparatus, the collecting unit including:

a buffer configured to temporarily store the collected data; and a sorting part configured to rearrange the collected data to a time series, based on time data attached to the collected data and store the rearranged data in the buffer, when the collected data is stored in the buffer; and a controller configured to attach the time data showing a collection time to the data generated in each component, and to transfer the data having the time data attached to the collecting unit, the controller including:

a control part for controlling each component based on a recipe for applying a prescribed processing to a substrate, the control part being configured to receive the data generated in each component, and the control part being configured to attach the time data to the received data, and an operation part for editing a target recipe, the operation part being configured to: (i) receive the data generated in each component, attach the time data to the received data, and transfer the data attached to the time data to the collecting unit, and (ii) receive the data attached to the time data by the control part and transfer the data attached to the time data to the collecting unit, wherein the collecting unit is configured to:

(i) store the received data to the time series in the buffer based on the time data attached by the controller, when the data generated in each component is received through the controller;

(ii) store empty data of only the time data in the buffer, when the data is not stored in the buffer for a prescribed period; and (iii) send the data having the time data attached to at least one of the host and the database of the semiconductor manufacturing plant side.

2. The control system of a substrate processing apparatus according to claim 1, wherein the control part comprises:

a first control part configured to control prescribed substrate processing applied to the substrate; and a second control part configured to control prescribed substrate carrying applied to the substrate;

wherein the collecting unit is configured to store in the buffer the data transmitted from the operation part in an order of time data, based on the time data attached in the first control part and the second control part.

3. The control system of a substrate processing apparatus according to claim 2, wherein data stored in the buffer is apparatus monitoring data including various control data, event data, and exceptional data.

4. The control system of a substrate processing apparatus according to claim 1, wherein a time range holdable data stored in the buffer is determined by a maximum delay time from collecting the data by the control part, to transmitting the data to the collecting unit through the operation part.

5. The control system of a substrate processing apparatus according to claim 4, wherein data stored in the buffer is apparatus monitoring data including various control data, event data, and exceptional data.

6. The control system of a substrate processing apparatus according to claim 1, wherein the data stored in the buffer is apparatus monitoring data including various control data, event data, and exceptional data.

7. The control system of a substrate processing apparatus according to claim 1, wherein the buffer is configured to provide a time list for controlling the data having the same time data, and the collecting unit is configured to compare the data with the list controlling time in the buffer and store the data in the coincident time list.

8. The control system of a substrate processing apparatus according to claim 7, wherein the time list is configured to be able to store a plurality of the data.

9. The control system of a substrate processing apparatus according to claim 1, wherein the required time range of the data stored in the buffer is determined by the time difference between the oldest list and the newest list.

10. The control system of a substrate processing apparatus according to claim 1, wherein the buffer is configured to store the collected data during the constant time in order to absorb a delay time which occurs when the data is collected through the controller; and the collecting unit is configured to store the collected data in the buffer when the collecting time of the collected data falls in a constant time from a newest data collecting time in the buffer, and make a new buffer and store the collected data in the new buffer when the collecting time of the collected data does not fall in a constant time from the newest data collecting time in the buffer.

11. The control system of a substrate processing apparatus according to claim 10, wherein the collecting unit is configured to transmit the data stored in the oldest buffer to a synchronization part, and delete the data from the oldest buffer, when the collecting time exceeds the constant time.

12. A control method for high frequent data collection between at least one of a host and a database of a semiconductor manufacturing plant side and a substrate processing apparatus having a plurality of components and including a collecting unit configured to collect data from the plurality of components, the method comprising:

collecting data generated in each component of the substrate processing apparatus;

attaching time data showing a collection time to the data generated in each component and transferring the data having the time data attached to the collecting unit, by a controller;

attaching the time data to the data generated in each component by a control part for controlling each component based on a recipe for applying a prescribed processing to a substrate;

attaching the time data to the data generated in each component and transferring the data attached to the time data to the collecting unit;

transferring the data attached to the time data by the control part to the collecting unit, by an operation part for editing a target recipe;

storing the received data to the time series in a buffer based on the time data attached by the controller, when the data generated in each component is received through the controller;

storing empty data of only the time data in the buffer, when the data is not stored in the buffer for a prescribed period; and sending the data having the lime data attached to at least one of the host and the database of the semiconductor manufacturing plant side.

* * * * *